US012588252B2

(12) United States Patent　　　　(10) Patent No.:　US 12,588,252 B2
Chu et al.　　　　　　　　　　　　(45) Date of Patent:　　Mar. 24, 2026

(54) FIN TRIM PLUG STRUCTURES WITH METAL FOR IMPARTING CHANNEL STRESS

(71) Applicant: Intel Corporation, Santa Clara, CA (US)

(72) Inventors: Tao Chu, Portland, OR (US); Feng Zhang, Hillsboro, OR (US); Minwoo Jang, Portland, OR (US); Yanbin Luo, Portland, OR (US); Chia-Ching Lin, Portland, OR (US); Ting-Hsiang Hung, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 17/940,944

(22) Filed: Sep. 8, 2022

(65) Prior Publication Data

US 2024/0088292 A1　　Mar. 14, 2024

(51) Int. Cl.
H10D 30/69　　(2025.01)
H10B 10/00　　(2023.01)
H10D 30/62　　(2025.01)

(52) U.S. Cl.
CPC ........... H10D 30/795 (2025.01); H10B 10/12 (2023.02); H10D 30/62 (2025.01); H10D 30/794 (2025.01)

(58) Field of Classification Search
CPC .... H10D 30/795; H10D 30/62; H10D 30/794; H10D 30/6211; H10D 30/024; H10B 10/12
See application file for complete search history.

(56) References Cited

U.S. PATENT DOCUMENTS

| | | |
|---|---|---|
| 2016/0043222 A1 | 2/2016 | Cho |
| 2018/0366329 A1 | 12/2018 | Kim |
| 2019/0355719 A1 | 11/2019 | Maeda |
| 2020/0220016 A1* | 7/2020 | Guler ................ H01L 21/02238 |
| 2022/0344494 A1 | 10/2022 | Joshi |

FOREIGN PATENT DOCUMENTS

DE　　102018127575　　6/2019

OTHER PUBLICATIONS

Extended European Search Report for European Patent No. 23185993.5 mailed Feb. 6, 2024, 8 pgs.
Office Action from European Patent No. 23185993.5 mailed Dec. 4, 2025, 6 pgs.

* cited by examiner

*Primary Examiner* — Mohammad A Rahman
(74) *Attorney, Agent, or Firm* — Schwabe, Williamson & Wyatt P.C.

(57)　　　　ABSTRACT

Fin trim plug structures with metal for imparting channel stress are described. In an example, an integrated circuit structure includes a fin including silicon, the fin having a top and sidewalls, wherein the top has a longest dimension along a direction. A first isolation structure is over a first end of the fin. A gate structure including a gate electrode is over the top of and laterally adjacent to the sidewalls of a region of the fin. The gate structure is spaced apart from the first isolation structure along the direction. A second isolation structure is over a second end of the fin, the second end opposite the first end, the second isolation structure spaced apart from the gate structure along the direction. The first isolation structure and the second isolation structure both include a dielectric material laterally surrounding an isolated metal structure.

20 Claims, 26 Drawing Sheets

400

413B 413A
418 412A 413C 412C
412B 410
412 412 411 412 412 462
416
414
420
464C 460
404 464B 464A 406 464C
408
402
452 450
Y
422

FIN TRIM PLUG STRUCTURES WITH METAL FOR IMPARTING CHANNEL STRESS

TECHNICAL FIELD

Embodiments of the disclosure are in the field of advanced integrated circuit structure fabrication and, in particular, fin trim plug structures with metal for imparting channel stress and methods of fabricating fin trim plug structures with metal for imparting channel stress.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
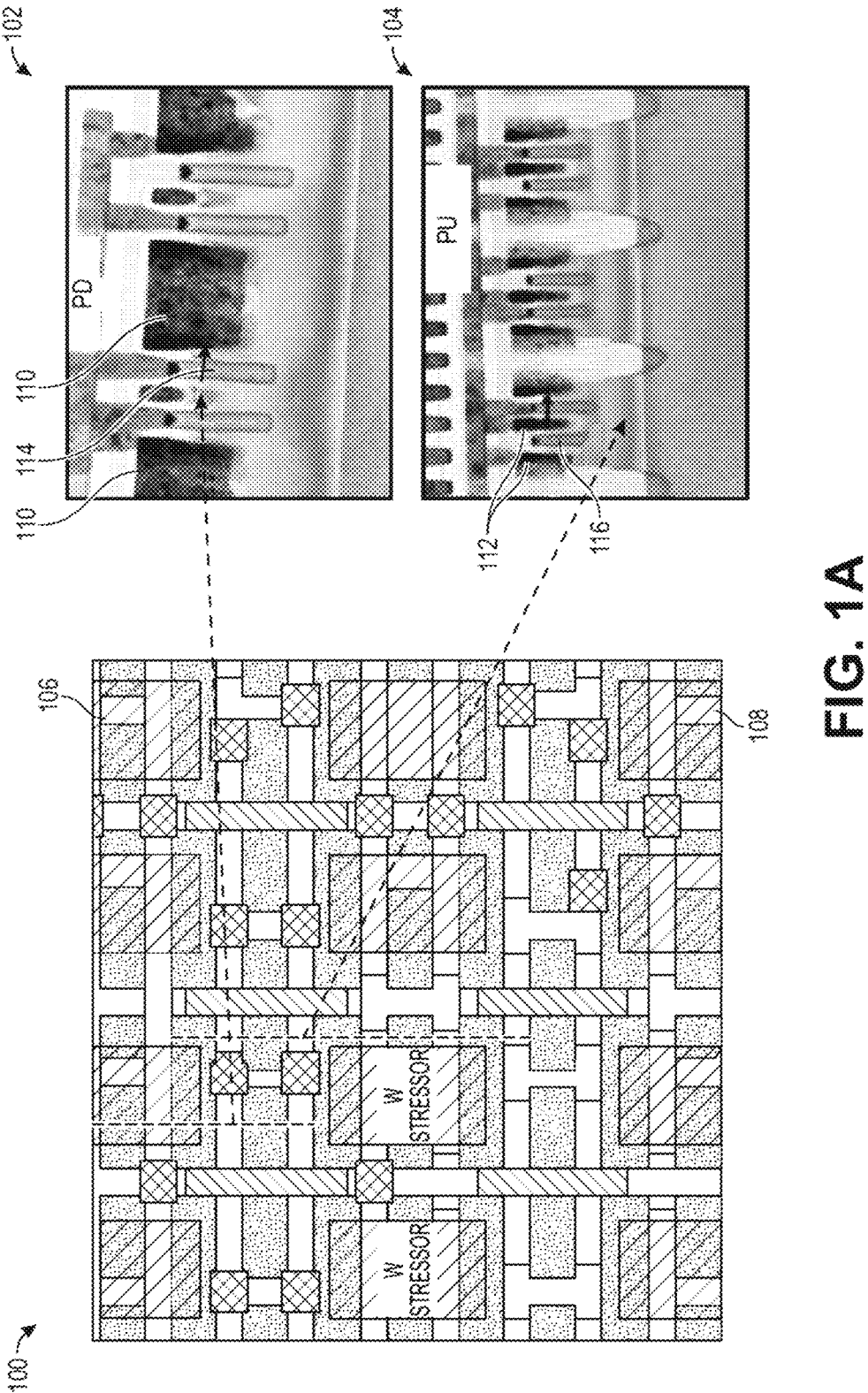
FIG. 1A includes an illustration of a plan view of an SRAM array and corresponding cross-sectional images of a pull-down (PD) transistor and a pull-up (PU) transistor including tungsten-based stressor features, in accordance with an embodiment of the present disclosure.

Advanced integrated circuit structure fabrication is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments described herein are directed to plugs including an isolated metal structure. Dielectric plugs can be used to effectively provide electrical discontinuity in conductive features such as gate and/or in semiconductive features such as fins. Described herein are plugs including an isolated metal structure therein. Since the metal is effectively isolated by a surrounding dielectric material, such structures can still be referred to as dielectric plugs, or dielectric plugs having an isolated metal structure enclosed therein, or a structure having a dielectric fill enclosing an isolated metal structure. In one or more embodiments, the isolated metal structure provides stress for nearby structures.

In particular embodiments, the isolated metal structure is or includes tungsten, which may be deposited by ALD, CVD or PVD. In embodiments a dielectric liner or fill that effectively isolates the isolated metal structure from other features acts to provide a dielectric or insulating break, and the structure as a whole acts to provide a dielectric or insulating break, e.g., for gates and/or fins. In one such embodiment, the dielectric liner or fill has a thickness in the range of 4-5 nanometers. In embodiments, the isolated metal structure is tungsten and provides a tensile stress to nearby structures. In other embodiments, an isolated metal structure in a plug is used to provide compressive stress.

In particular embodiments, a tungsten (W) stressor is used for SRAM device performance boost. To provide context, SRAM performance has been a challenging topic for advanced node in industry due to the tight design rules. Short channel effect can get worse due to poly remaining and other compact layout design issues. In an embodiment, a W stressor (e.g., in the form of a plug) is used boost SRAM performance. In one embodiment, by introducing a large volume of W stress can be introduced and pull-up (PU)

performance boosted, improving PMOS pull-up (PU) DIBL and boosting PMOS PU performance.

Approaches to addressing performance needs have included growing a smaller epi for SRAM, however, smaller epi can lead to higher Rext and lower mobility and thus worse performance. Approaches to addressing performance needs have included using a metal gate cut to ensure less remaining poly and better DIBL/SS, however, process complication and design change may be needed.

In one aspect, a tungsten (W) containing stress feature is included to provide stress in an SRAM array and to stress a pull-up (PU) transistor. Improvement in drain induced barrier leakage (DIBL)/sub-threshold slope (SS) and other parameters may be realized by implementing embodiments described herein.

FIG. 1A includes an illustration of a plan view of an SRAM array 100 and corresponding cross-sectional images of a pull-down (PD) transistor 102 and a pull-up (PU) transistor 104 including tungsten-based stressor features, in accordance with an embodiment of the present disclosure.

Referring to FIG. 1A, the plan view shows locations where W stressor features 106, e.g., a plugs including an isolated metal structure (W). The PD transistor 102 includes W stressors 110 on either side of active gates 114. The PU transistor 104 includes W stressors 112 on either side of active gates 116. Advantages to including such W stressor can include providing a feature that stresses poly (gates) and the fin to provide better control over short channel effects (SCEs), such as lower SS/DIBL and better ISEEF@OPT as observed for W stressor devices.

Figure 1B:
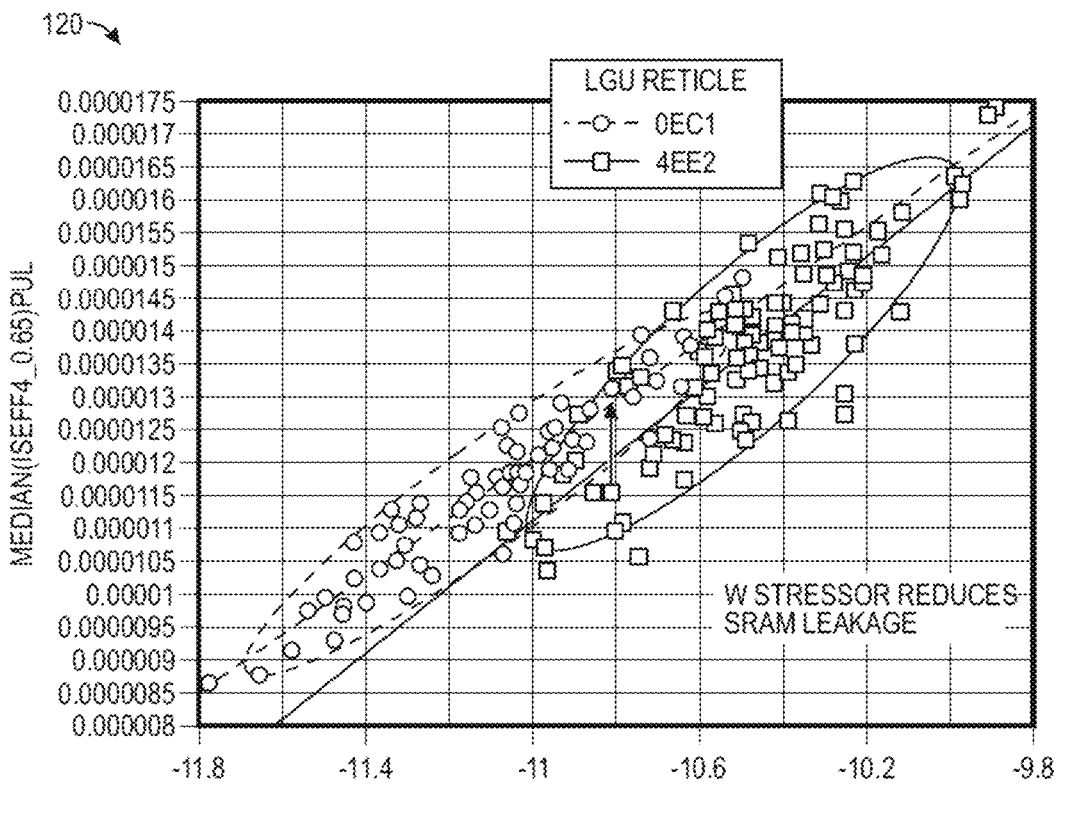
FIG. 1B is a plot indicating the use of a W stressor reduces SRAM leakage (circles versus squares), and a plot indicating a boost in effective current (circles versus squares), in accordance with an embodiment of the present disclosure.
Figure 1B:
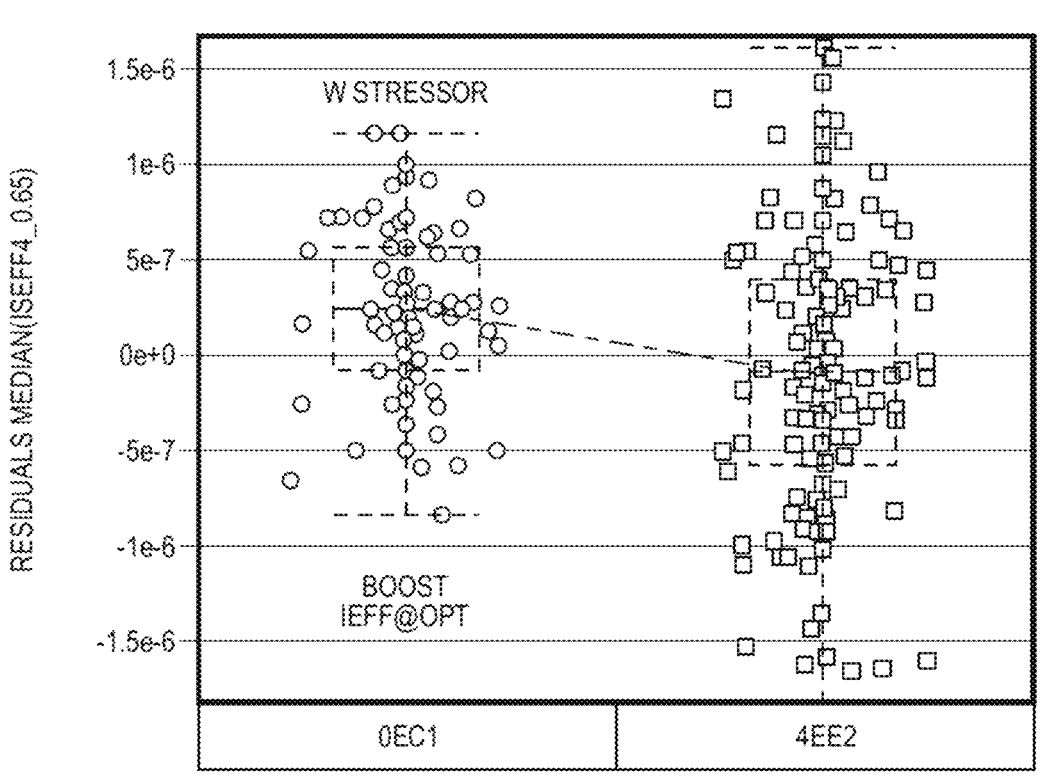

FIG. 1B is a plot 120 indicating the use of a W stressor reduces SRAM leakage (circles versus squares), and a plot 130 indicating a boost in effective current (circles versus squares), in accordance with an embodiment of the present disclosure.

Figure 1C:
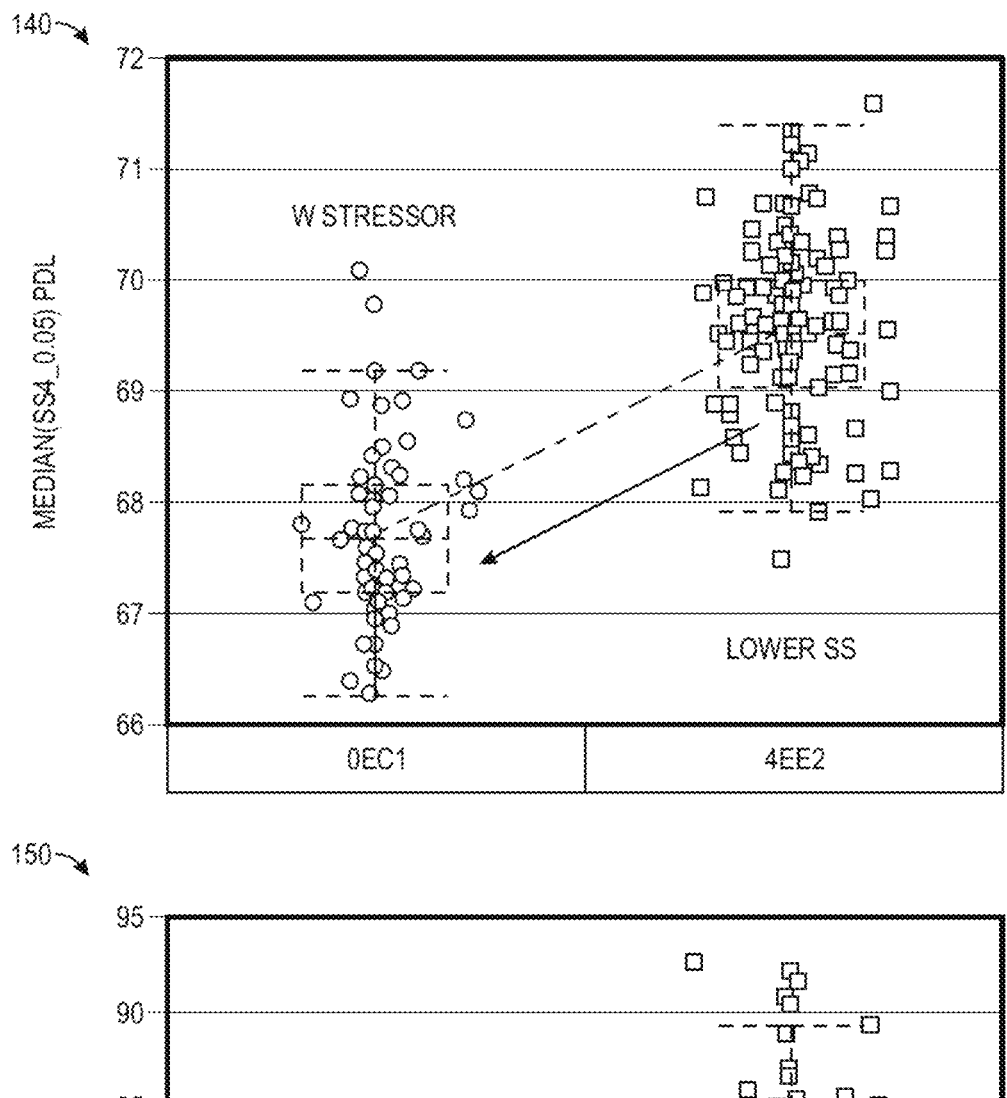
FIG. 1C is a plot indicating the use of a W stressor reduces sub-threshold slope (circles versus squares), and a plot indicating a reduction in drain induced barrier leakage, in accordance with an embodiment of the present disclosure.

FIG. 1C is a plot 140 indicating the use of a W stressor reduces sub-threshold slope (circles versus squares), and a plot 150 indicating a reduction in drain induced barrier leakage, in accordance with an embodiment of the present disclosure.

Figure 1D:
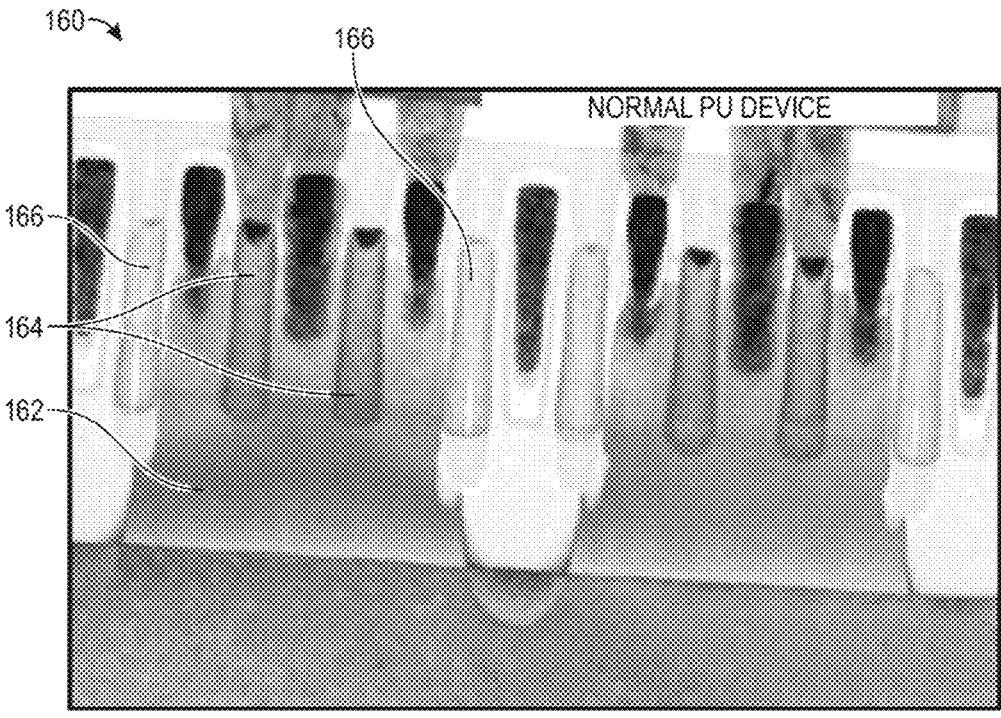
FIGS. 1D-1E are cross-sectional images of a pull-up (PU) transistor without a tungsten stressor, and a pull-up (PU) transistor with a tungsten stressor, respectively, in accordance with an embodiment of the present disclosure.
Figure 1E:
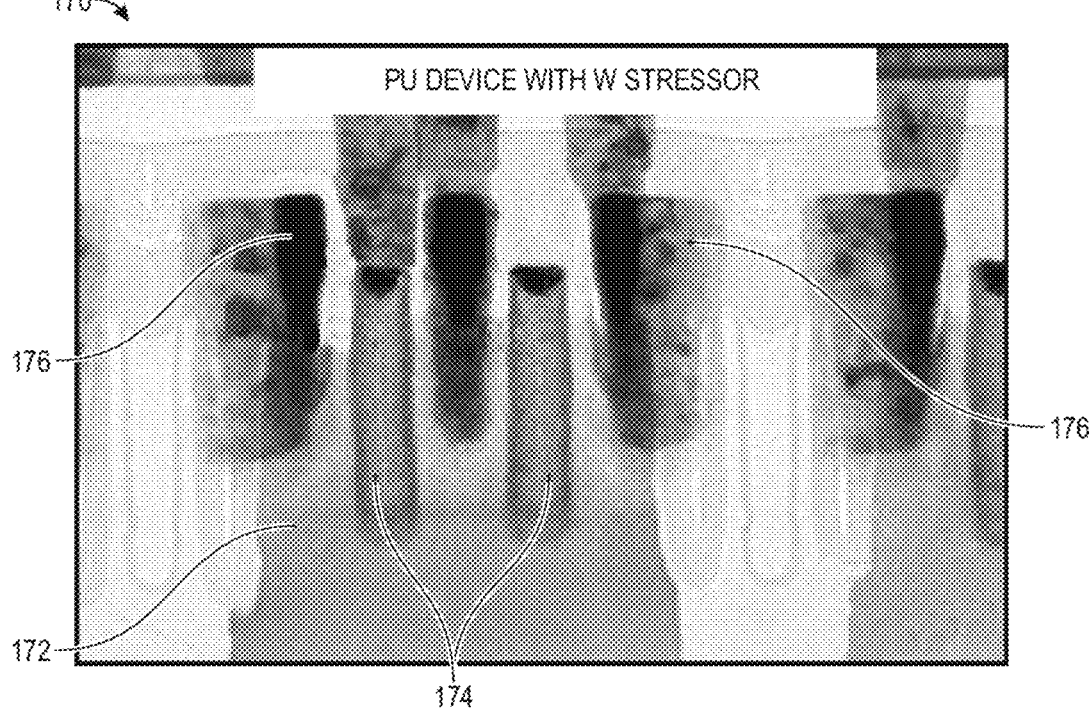

FIGS. 1D-1E are cross-sectional images of a pull-up (PU) transistor without a tungsten stressor, and a pull-up (PU) transistor with a tungsten stressor, respectively, in accordance with an embodiment of the present disclosure.

Referring to FIG. 1D, a pull-up (PU) transistor 160 includes a fin 162, gate structures 164, fin end dummy gates or gate plugs 166. Tungsten stressors are not included.

Referring to FIG. 1E, a pull-up (PU) transistor 170 includes a fin 172, gate structures 174, and tungsten stressor structures 176. In one embodiments, the tungsten stressor structures 176 are effectively dielectric plugs having isolated tungsten therein.

In accordance with one or more embodiments described herein, fin-trim isolation (FTI) and single gate spacing for isolated fins is described. Non-planar transistors which utilize a fin of semiconductor material protruding from a substrate surface employ a gate electrode that wraps around two, three, or even all sides of the fin (i.e., dual-gate, tri-gate, nanowire transistors, nanoribbon transistors, nanosheet transistors). Source and drain regions are typically then formed in the fin, or as re-grown portions of the fin, on either side of the gate electrode. To isolate a source or drain region of a first non-planar transistor from a source or drain region of an adjacent second non-planar transistor, a gap or space may be formed between two adjacent fins. Such an isolation gap generally requires a masked etch of some sort. Once isolated, a gate stack is then patterned over the individual fins, again typically with a masked etch of some sort (e.g., a line etch or an opening etch depending on the specific implementation).

One potential issue with the fin isolation techniques described above is that the gates are not self-aligned with the ends of the fins, and alignment of the gate stack pattern with the semiconductor fin pattern relies on overlay of these two patterns. As such, lithographic overlay tolerances are added into the dimensioning of the semiconductor fin and the isolation gap with fins needing to be of greater length and isolation gaps larger than they would be otherwise for a given level of transistor functionality. Device architectures and fabrication techniques that reduce such over-dimensioning therefore offer highly advantageous improvements in transistor density.

Another potential issue with the fin isolation techniques described in the above is that stress in the semiconductor fin desirable for improving carrier mobility may be lost from the channel region of the transistor where too many fin surfaces are left free during fabrication, allowing fin strain to relax. Device architectures and fabrication techniques that maintain higher levels of desirable fin stress therefore offer advantageous improvements in non-planar transistor performance.

In accordance with an embodiment of the present disclosure, through-gate fin isolation architectures and techniques are described herein. In the exemplary embodiments illustrated, non-planar transistors in a microelectronic device, such as an integrated circuit (IC) are isolated from one another in a manner that is self-aligned to gate electrodes of the transistors. Although embodiments of the present disclosure are applicable to virtually any IC employing non-planar transistors, exemplary ICs include, but are not limited to, microprocessor cores including logic and memory (SRAM) portions, RFICs (e.g., wireless ICs including digital baseband and analog front end modules), and power ICs.

In embodiments, two ends of adjacent semiconductor fins are electrically isolated from each other with an isolation region that is positioned relative to gate electrodes with the use of only one patterning mask level. In an embodiment, a single mask is employed to form a plurality of sacrificial placeholder stripes of a fixed pitch, a first subset of the placeholder stripes define a location or dimension of isolation regions while a second subset of the placeholder stripes defines a location or dimension of a gate electrode. In certain embodiments, the first subset of placeholder stripes is removed and isolation cuts made into the semiconductor fins in the openings resulting from the first subset removal while the second subset of the placeholder stripes is ultimately replaced with non-sacrificial gate electrode stacks. Since a subset of placeholders utilized for gate electrode replacement are employed to form the isolation regions, the method and resulting architecture is referred to herein as "through-gate" isolation. One or more through-gate isolation embodiments described herein may, for example, enable higher transistor densities and higher levels of advantageous transistor channel stress.

With isolation defined after placement or definition of the gate electrode, a greater transistor density can be achieved because fin isolation dimensioning and placement can be made perfectly on-pitch with the gate electrodes so that both gate electrodes and isolation regions are integer multiples of a minimum feature pitch of a single masking level. In further embodiments where the semiconductor fin has a lattice mismatch with a substrate on which the fin is disposed, greater degrees of strain are maintained by defining the isolation after placement or definition of the gate electrode. For such embodiments, other features of the transistor (such as the gate electrode and added source or drain materials) that are formed before ends of the fin are defined help to mechanically maintain fin strain after an isolation cut is made into the fin.

To provide further context, transistor scaling can benefit from a denser packing of cells within the chip. Currently, most cells are separated from their neighbors by two or more dummy gates, which have buried fins. The cells are isolated by etching the fins beneath these two or more dummy gates, which connect one cell to the other. Scaling can benefit significantly if the number of dummy gates that separate neighboring cells can be reduced from two or more down to one. As explained above, one solution requires two or more dummy gates. The fins under the two or more dummy gates are etched during fin patterning. A potential issue with such an approach is that dummy gates consume space on the chip which can be used for cells. In an embodiment, approaches described herein enable the use of only a single dummy gate to separate neighboring cells.

In an embodiment, a fin trim isolation approach is implemented as a self-aligned patterning scheme. Here, the fins beneath a single gate are etched out. Thus, neighboring cells can be separated by a single dummy gate. Advantages to such an approach may include saving space on the chip and allowing for more computational power for a given area. The approach may also allow for fin trim to be performed at a sub-fin pitch distance.

FIGS. 2A-2D illustrate plan views representing various operations in a method of patterning of fins with single gate spacing for forming a local isolation structure, in accordance with another embodiment of the present disclosure.

Figure 2A:
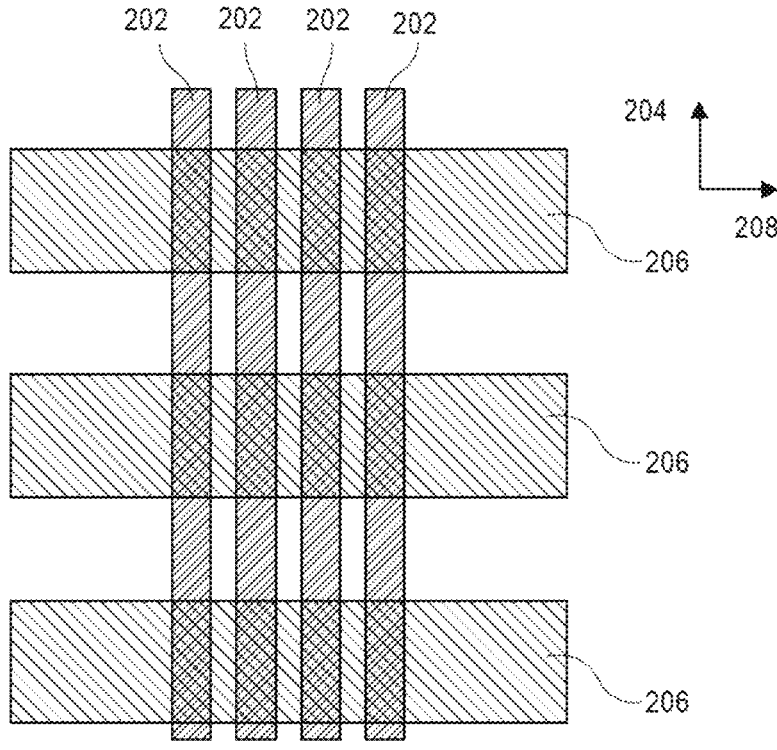
FIGS. 2A-2D illustrate plan views representing various operations in a method of patterning of fins with single gate spacing for forming a local isolation structure, in accordance with another embodiment of the present disclosure.

Referring to FIG. 2A, a method of fabricating an integrated circuit structure includes forming a plurality of fins 202, individual ones of the plurality of fins 202 having a longest dimension along a first direction 204. A plurality of gate structures 206 is over the plurality of fins 202, individual ones of the gate structures 206 having a longest dimension along a second direction 208 orthogonal to the first direction 204. In an embodiment, the gate structures 206 are sacrificial or dummy gate lines, e.g., fabricated from polycrystalline silicon. In one embodiment, the plurality of fins 202 are silicon fins and are continuous with a portion of an underlying silicon substrate.

Figure 2B:
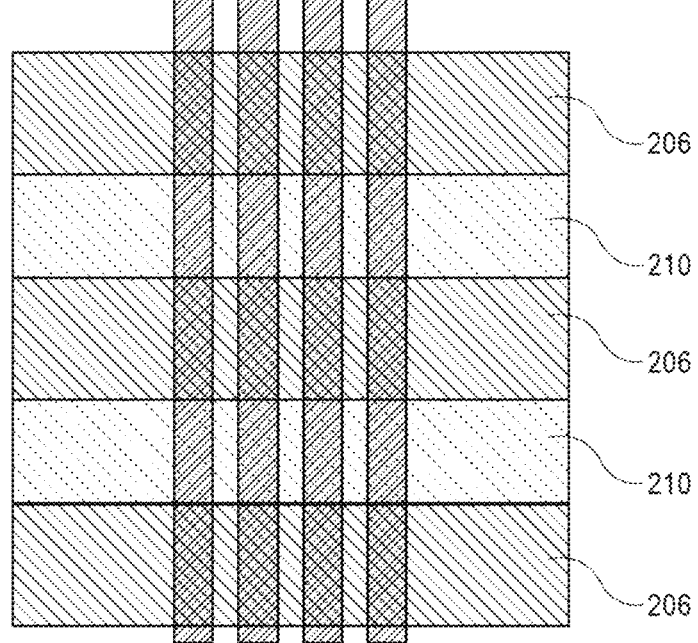

Referring to FIG. 2B, a dielectric material structure 210 is formed between adjacent ones of the plurality of gate structures 206.

Figure 2C:
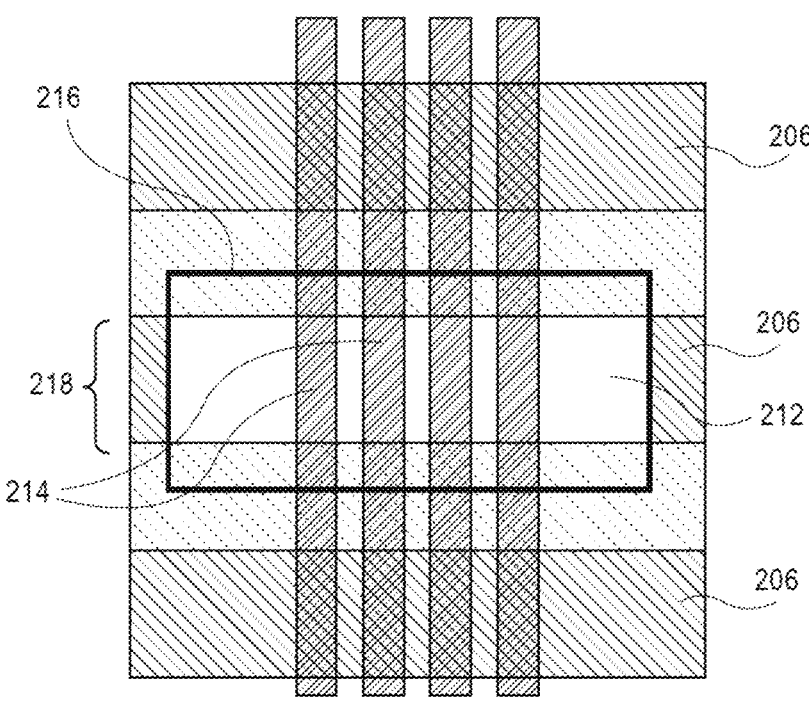

Referring to FIG. 2C, a portion 212 of one of the plurality of gate structures 206 is removed to expose a portion 214 of each of the plurality of fins 202. In an embodiment, removing the portion 212 of the one of the plurality of gate structures 206 involves using a lithographic window 216 wider than a width 218 of the portion 212 of the one of the plurality of gate structures 206.

Figure 2D:
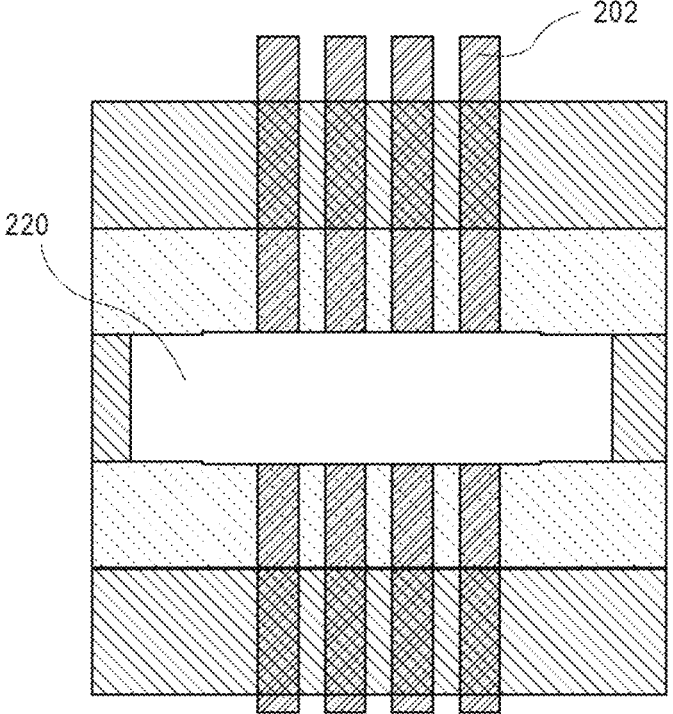

Referring to FIG. 2D, the exposed portion 214 of each of the plurality of fins 202 is removed to form a cut region 220. In an embodiment, the exposed portion 214 of each of the plurality of fins 202 is removed using a dry or plasma etch process. In an embodiment, removing the exposed portion 214 of each of the plurality of fins 202 involves etching to a depth less than a height of the plurality of fins 202. In one such embodiment, the depth is greater than a depth of source or drain regions in the plurality of fins 202. In an embodiment, the depth is deeper than a depth of an active portion of the plurality of fins 202 to provide isolation margin. In an embodiment, the exposed portion 214 of each of the plurality of fins 202 is removed without etching or without substantially etching source or drain regions (such as epitaxial source or drain regions) of the plurality of fins 202. In one such embodiment, the exposed portion 214 of each of the plurality of fins 202 is removed without laterally etching or without substantially laterally etching source or drain regions (such as epitaxial source or drain regions) of the plurality of fins 202.

In an embodiment, the cut region 220 is ultimately filled with an insulating layer, e.g., in locations of the removed portion 214 of each of the plurality of fins 202. Exemplary insulating layers or "poly cut" or "plug" structures with isolated metal are described below.

Figure 3:
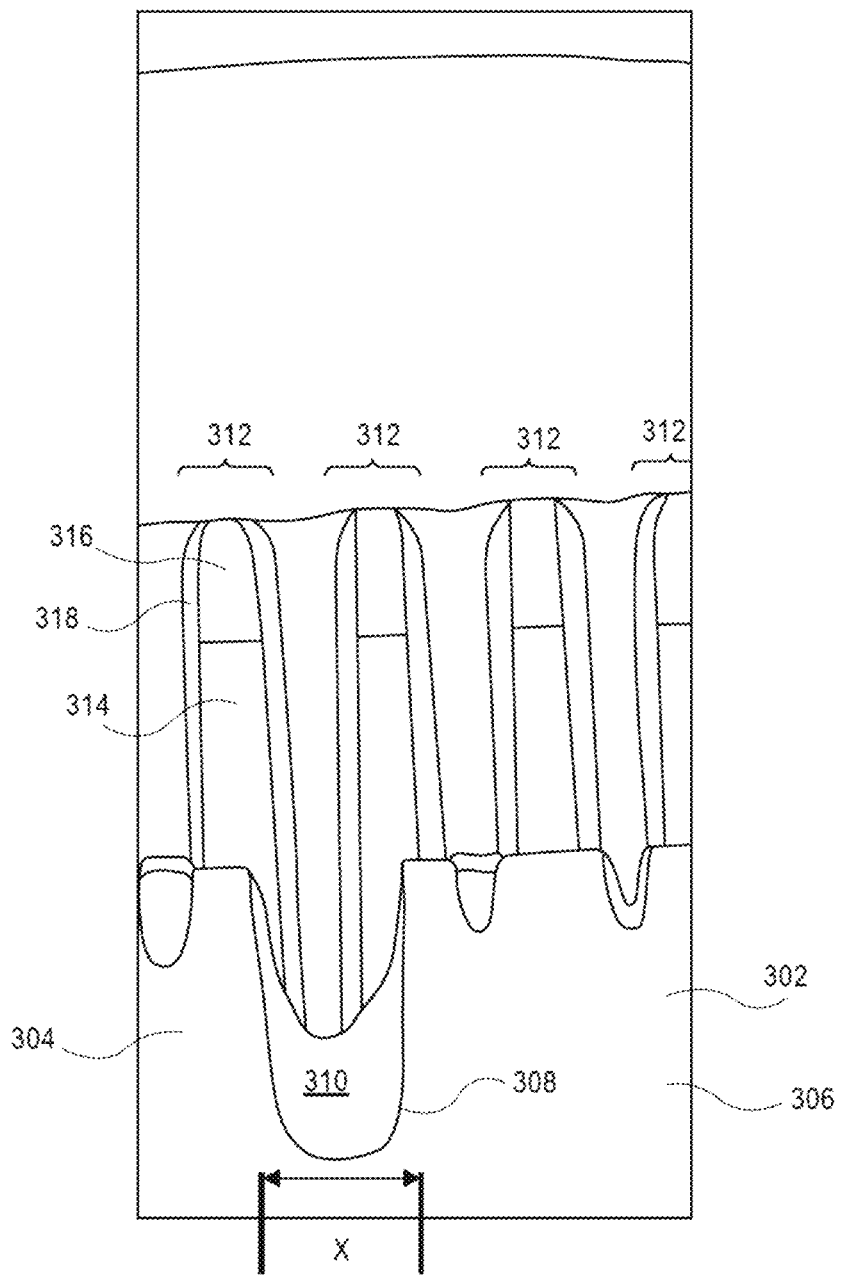
FIG. 3 illustrates a cross-sectional view of an integrated circuit structure having a fin with multi-gate spacing for local isolation, in accordance with an embodiment of the present disclosure.

FIG. 3 illustrates a cross-sectional view of an integrated circuit structure having a fin with multi-gate spacing for local isolation, in accordance with an embodiment of the present disclosure.

Referring to FIG. 3, a silicon fin 302 has a first fin portion 304 laterally adjacent a second fin portion 306. The first fin portion 304 is separated from the second fin portion 306 by a relatively wide cut 308, the relatively wide cut 308 having a width X. A dielectric fill material 310, which can enclose an isolated metal structure is formed in the relatively wide cut 308 and electrically isolates the first fin portion 304 from the second fin portion 306. A plurality of gate lines 312 is over the silicon fin 302, where each of the gate lines may include a gate dielectric and gate electrode stack 314, a dielectric cap layer 316, and sidewall spacers 318. Two gate lines (left two gate lines 312) occupy the relatively wide cut 308 and, as such, the first fin portion 304 is separated from the second fin portion 306 by effectively two dummy or inactive gates.

By contrast, fin portions may be separated by a single gate distance. As an example, FIG. 4A illustrates a cross-sectional view of an integrated circuit structure having a fin with single gate spacing for local isolation, in accordance with another embodiment of the present disclosure.

Figure 4A:
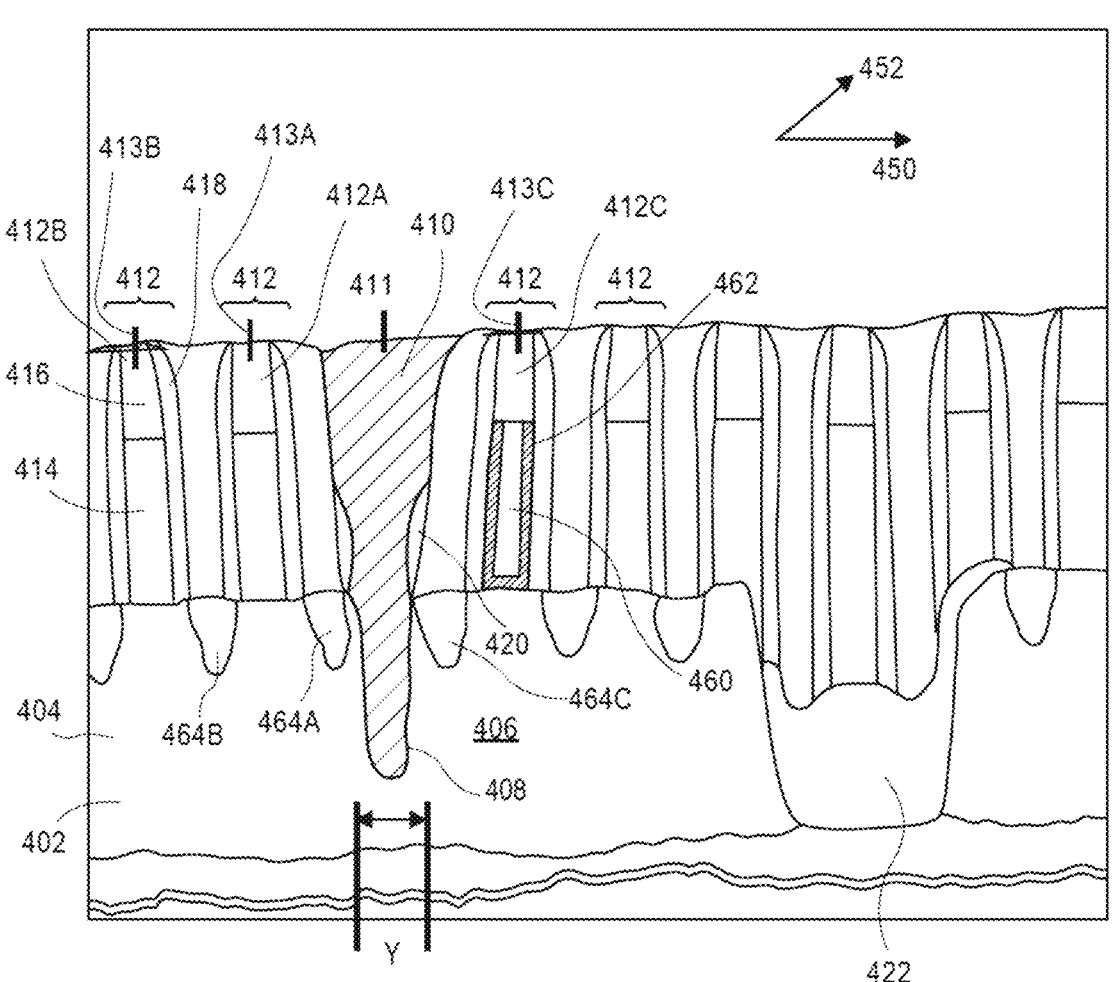
FIG. 4A illustrates a cross-sectional view of an integrated circuit structure having a fin with single gate spacing for local isolation, in accordance with another embodiment of the present disclosure.

Referring to FIG. 4A, a silicon fin 402 has a first fin portion 404 laterally adjacent a second fin portion 406. The first fin portion 404 is separated from the second fin portion 406 by a relatively narrow cut 408, such as described in association with FIGS. 2A-2D, the relatively narrow cut 408 having a width Y, where Y is less than X of FIG. 3. A dielectric fill material 410, which can enclose an isolated metal structure, is formed in the relatively narrow cut 408 and electrically isolates the first fin portion 404 from the second fin portion 406. A plurality of gate lines 412 is over the silicon fin 402, where each of the gate lines may include a gate dielectric and gate electrode stack 414, a dielectric cap layer 416, and sidewall spacers 418. The dielectric fill material 410, which can enclose an isolated metal structure, occupies the location where a single gate line was previously and, as such, the first fin portion 404 is separated from the second fin portion 406 by single "plugged" gate line. In one embodiment, residual spacer material 420 remains on the sidewalls of the location of the removed gate line portion, as depicted. It is to be appreciated that other regions of the fin 402 may be isolated from one another by two or even more inactive gate lines (region 422 having three inactive gate lines) fabricated by an earlier, broader fin cut process, as described below.

Referring again to FIG. 4A, an integrated circuit structure 400 a fin 402, such as a silicon fin. The fin 402 has a longest dimension along a first direction 450. An isolation structure 410 separates a first upper portion 404 of the fin 402 from a second upper portion 406 of the fin 402 along the first direction 450. The isolation structure 410 has a center 411 along the first direction 450.

A first gate structure 412A is over the first upper portion 404 of the fin 402, the first gate structure 412A has a longest dimension along a second direction 452 (e.g., into the page) orthogonal to the first direction 450. A center 413A of the first gate structure 412A is spaced apart from the center 411 of the isolation structure 410 by a pitch along the first direction 450. A second gate structure 412B is over the first upper portion 404 of the fin 402, the second gate structure 412B having a longest dimension along the second direction 452. A center 413B of the second gate structure 412B is spaced apart from the center 413A of the first gate structure 412A by the pitch along the first direction 450. A third gate structure 412C is over the second upper portion 406 of the fin 402, the third gate structure 412C having a longest dimension along the second direction 452. A center 413C of the third gate structure 412C is spaced apart from the center 411 of the isolation structure 410 by the pitch along the first direction 450. In an embodiment, the isolation structure 410 has a top substantially co-planar with a top of the first gate structure 412A, with a top of the second gate structure 412B, and with a top of the third gate structure 412C, as is depicted.

In an embodiment, each of the first gate structure 412A, the second gate structure 412B and the third gate structure 412C includes a gate electrode 460 on and between sidewalls of a high-k gate dielectric layer 462, as is illustrated for exemplary third gate structure 412C. In one such embodiment, each of the first gate structure 412A, the second gate structure 412B and the third gate structure 412C further includes an insulating cap 416 on the gate electrode 460 and on and the sidewalls of the high-k gate dielectric layer 462.

In an embodiment, the integrated circuit structure 400 further includes a first epitaxial semiconductor region 464A on the first upper portion 404 of the fin 402 between the first gate structure 412A and the isolation structure 410. A second epitaxial semiconductor region 464B is on the first upper portion 404 of the fin 402 between the first gate structure 412A and the second gate structure 412B. A third epitaxial semiconductor region 464C is on the second upper portion 406 of the fin 402 between the third gate structure 412C and the isolation structure 410. In one embodiment, the first 464A, second 464B and third 464C epitaxial semiconductor regions include silicon and germanium. In another embodiment, the first 464A, second 464B and third 464C epitaxial semiconductor regions include silicon.

In an embodiment, the isolation structure 410 induces a stress on the first upper portion 404 of the fin 402 and on the second upper portion 406 of the fin 402. In one embodiment, the stress is a compressive stress. In another embodiment, the stress is a tensile stress. In other embodiments, the isolation structure 410 is a partially filling insulating layer in which a conductive structure is then formed. The conductive structure may be used as a local interconnect. In an embodiment, prior to forming the isolation structure 410 with an insulating layer or with an insulating layer housing a local interconnect structure, dopants are implanted or delivered by a solid source dopant layer into a locally cut portion of the fin or fins.

In another aspect, it is to be appreciated that isolation structures such as isolation structure 410 described above may be formed in place of active gate electrode at local locations of a fin cut or at broader locations of a fin cut. Additionally, the depth of such local or broader locations of fin cut may be formed to varying depths within the fin relative to one another. In a first example, FIG. 4B illustrates a cross-sectional view showing locations where a fin isolation structure may be formed in place of a gate electrode, in accordance with an embodiment of the present disclosure.

Figure 4B:
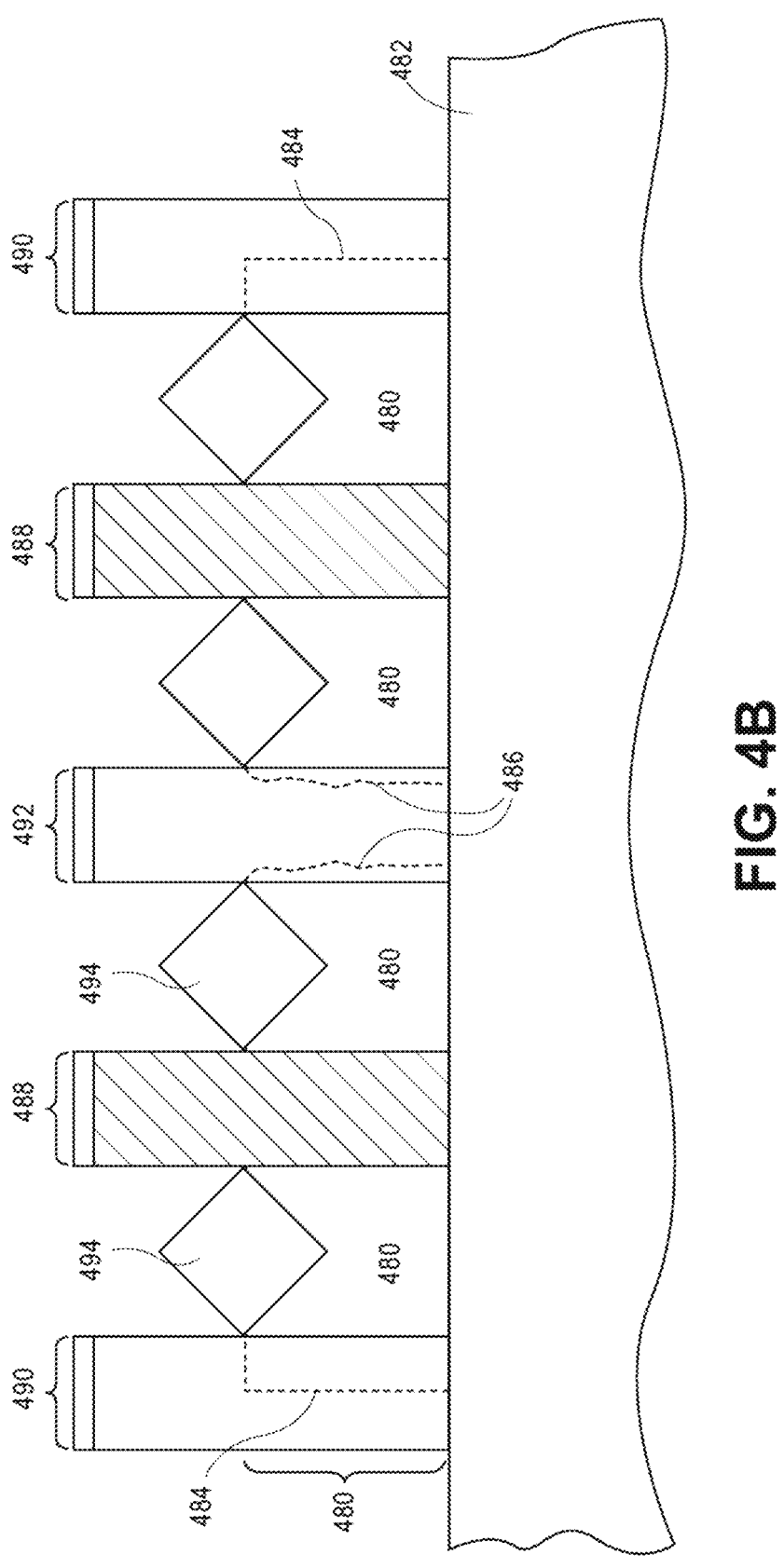
FIG. 4B illustrates a cross-sectional view showing locations where a fin isolation structure may be formed in place of a gate electrode, in accordance with an embodiment of the present disclosure.

Referring to FIG. 4B, a fin 480, such as a silicon fin, is formed above and may be continuous with a substrate 482. The fin 480 has fin ends or broad fin cuts 484, e.g., which may be formed at the time of fin patterning such as in a fin trim last approach described above. The fin 480 also has a local cut 486, where a portion of the fin 480 is removed, e.g., using a fin trim isolation approach where dummy gates are replaced with plugs having isolated metal, as described above. Active gate electrodes 488 are formed over the fin and, for the sake of illustration purposes, are shown slightly in front of the fin 480, with the fin 480 in the background, where the dashed lines represent areas covered from the front view. Plugs 490 including isolated metal may be formed at the fin ends or broad fin cuts 484 in place of using active gates at such locations. In addition, or in the alternative, a plug 492 including isolated metal may be formed at the local cut 486 in place of using an active gate at such a location. It is to be appreciated that epitaxial source or drain regions 494 are also shown at locations of the fins 480 between the active gate electrodes 488 and the plugs 490 or 492. Additionally, in an embodiment, the surface roughness of the ends of the fin at the local cut 486 are rougher than the ends of the fin at a location of a broader cut, as is depicted in FIG. 4B.

Figure 5A:
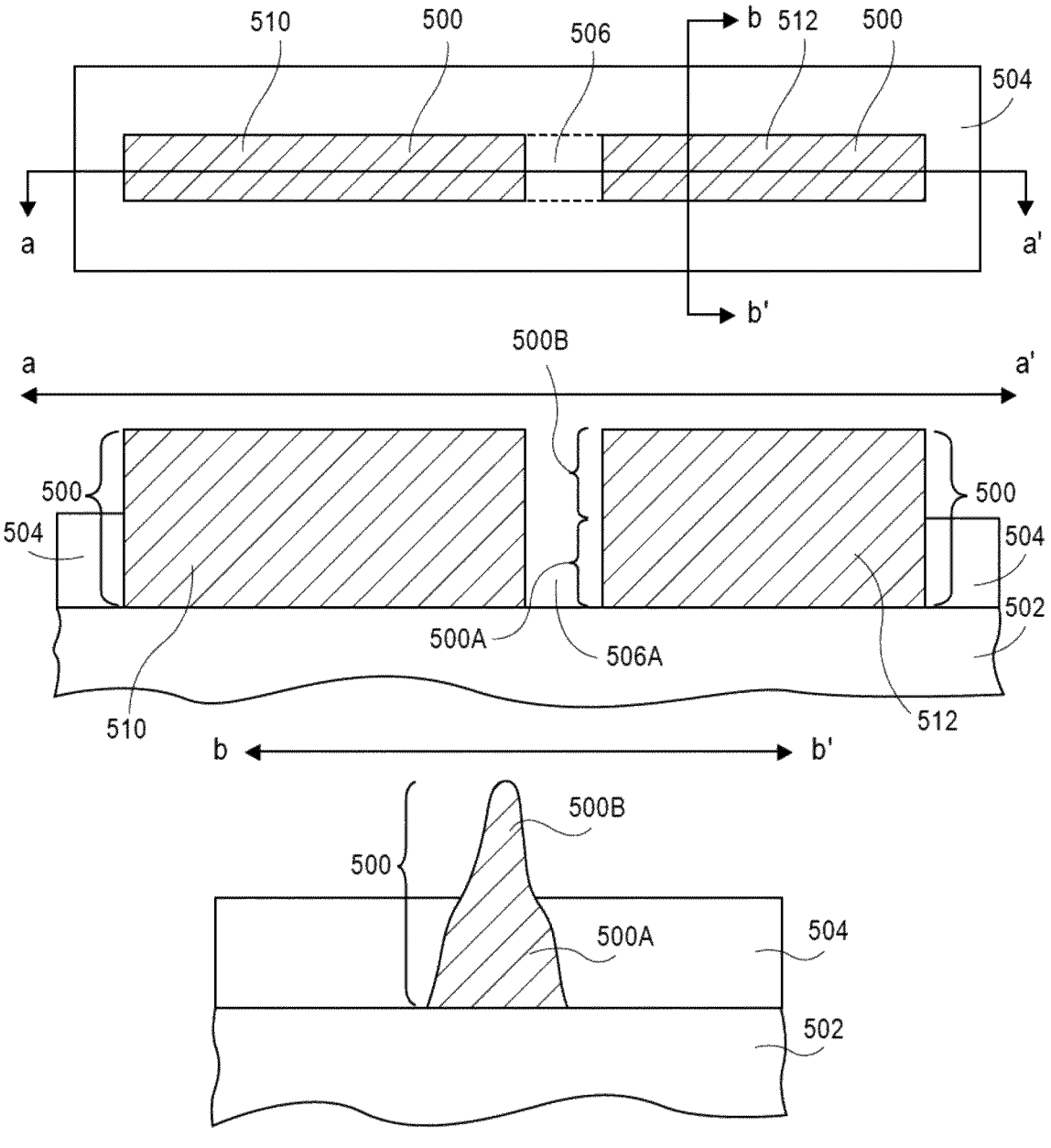
FIGS. 5A-5C illustrate various depth possibilities for a fin cut fabricated using fin trim isolation approach, in accordance with an embodiment of the preset disclosure.
Figure 5B:
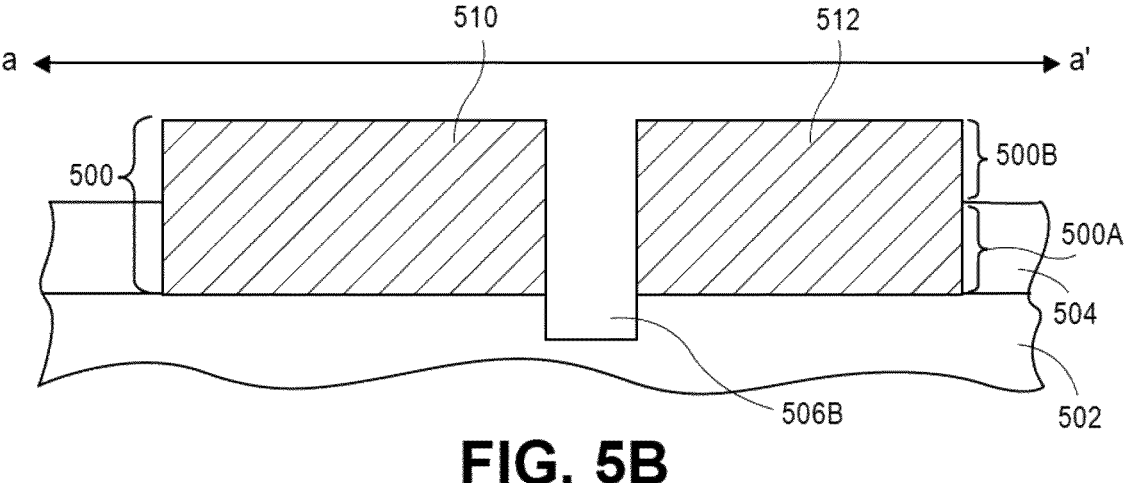
Figure 5C:
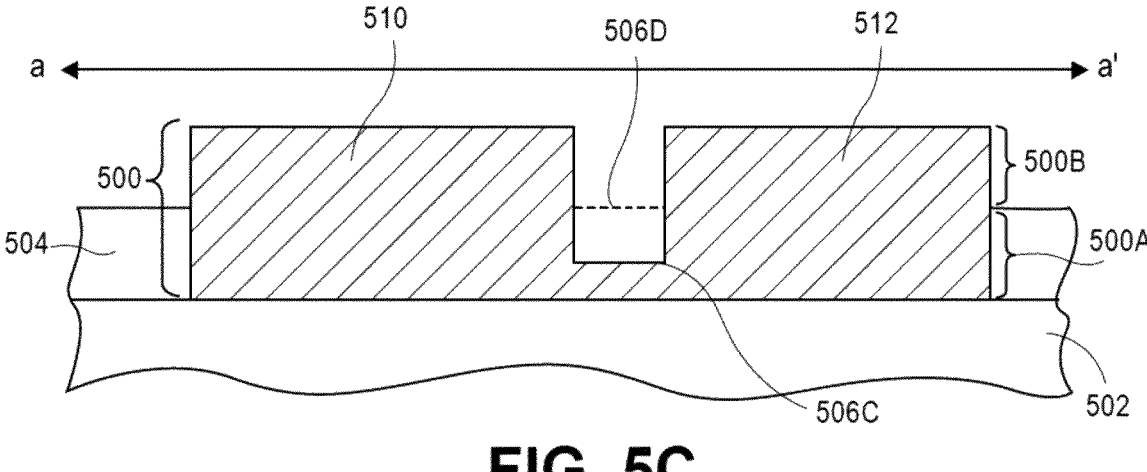

FIGS. 5A-5C illustrate various depth possibilities for a fin cut fabricated using fin trim isolation approach, in accordance with an embodiment of the preset disclosure.

Referring to FIG. 5A, a semiconductor fin 500, such as a silicon fin, is formed above and may be continuous with an underlying substrate 502. The fin 500 has a lower fin portion 500A and an upper fin portion 500B, as defined by the height of an insulating structure 504 relative to the fin 500. A local fin isolation cut 506A separates the fin 500 into a first fin portion 510 from a second fin portion 512. In the example of FIG. 5A, as shown along the a-a' axis, the depth of the local fin isolation cut 506A is the entire depth of the fin 500 to the substrate 502.

Referring to FIG. 5B, in a second example, as shown along the a-a' axis, the depth of a local fin isolation cut 506B is deeper than the entire depth of the fin 500 to the substrate 502. That is, the cut 506B extends into the underlying substrate 502.

Referring to FIG. 5C, in a third example, as shown along the a-a' axis, the depth of a local fin isolation cut 506C is less than the entire depth of the fin 500, but is deeper than an upper surface of the isolation structure 504. Referring again to FIG. 5C, in a fourth example, as shown along the a-a' axis, the depth of a local fin isolation cut 506D is less than the entire depth of the fin 500, and is at a level approximately co-planar with an upper surface of the isolation structure 504.

Figure 6:
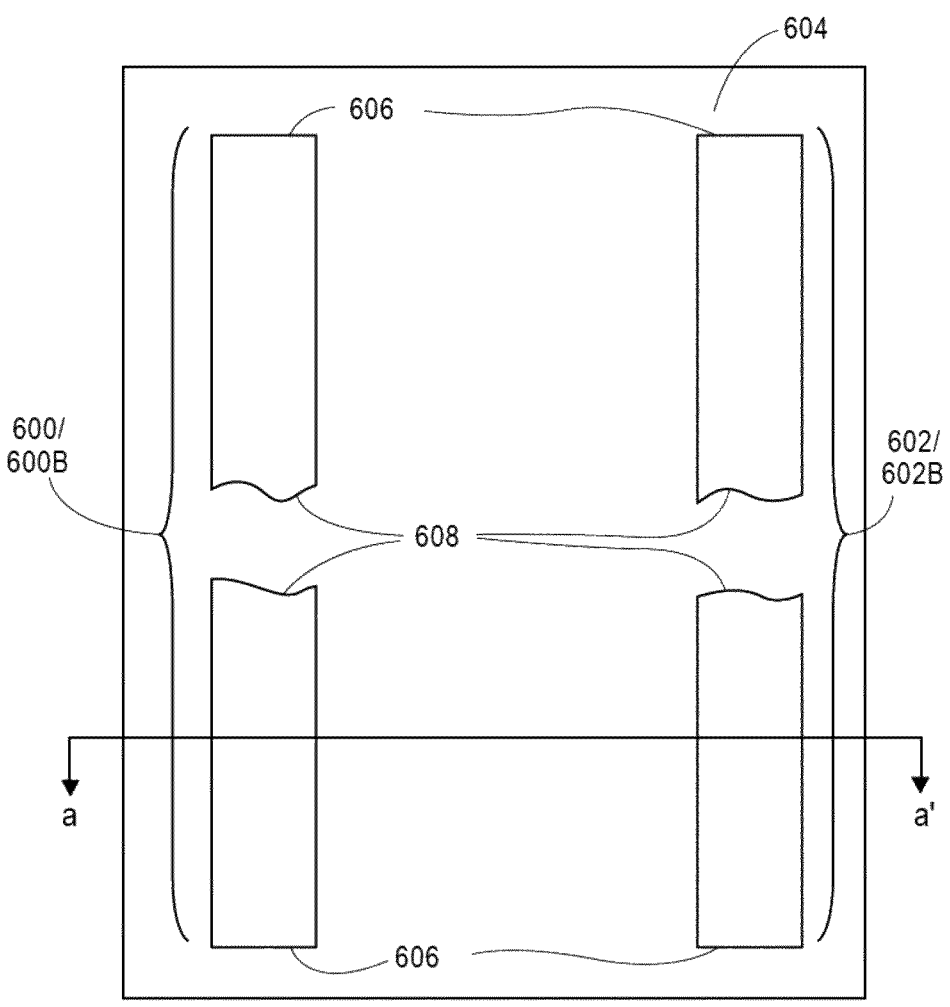
FIG. 6 illustrates a plan view and corresponding cross-sectional view taken along the a-a' axis showing possible options for the depth of local versus broader locations of fin cuts within a fin, in accordance with an embodiment of the present disclosure.
Figure 6:
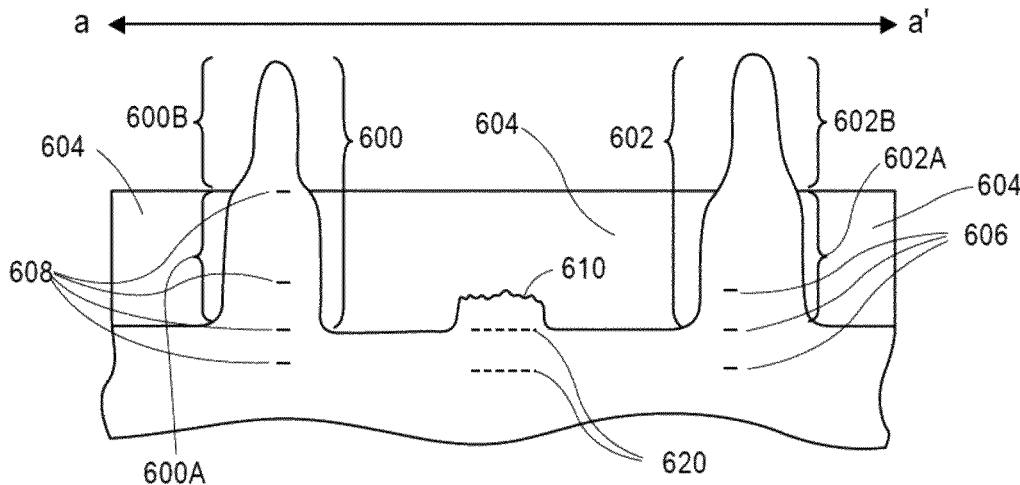

FIG. 6 illustrates a plan view and corresponding cross-sectional view taken along the a-a' axis showing possible options for the depth of local versus broader locations of fin cuts within a fin, in accordance with an embodiment of the present disclosure.

Referring to FIG. 6, first and second semiconductor fins 600 and 602, such as silicon fins, have upper fin portions 600B and 602B extending above an insulating structure 604. Both of the fins 600 and 602 have fin ends or broad fin cuts 606, e.g., which may be formed at the time of fin patterning such as in a fin trim last approach described above. Both of the fins 600 and 602 also have a local cut 608, where a portion of the fin 600 or 602 is removed, e.g., using a fin trim isolation approach where dummy gates are replaced with plugs having isolated metal, as described above. In an embodiment, the surface roughness of the ends of the fins 600 and 602 at the local cut 608 are rougher than the ends of the fins at a location of 606, as is depicted in FIG. 6.

Referring to the cross-sectional view of FIG. 6, lower fin portions 600A and 602A can be viewed below the height of the insulating structure 604. Also, seen in the cross-sectional view is a remnant portion 610 of a fin that was removed at a fin trim last process prior to formation of the insulating structure 604, as described above. Although shown as protruding above a substrate, remnant portion 610 could also be at the level of the substrate or into the substrate, as is depicted by the additional exemplary broad cut depths 620. It is to be appreciated that the broad cuts 606 for fins 600 and 602 may also be at the levels described for cut depth 620, examples of which are depicted. The local cut 608 can have exemplary depths corresponding to the depths described for FIGS. 5A-5C, as is depicted.

In another aspect, plugs having isolated metal and formed in locations of local or broad fin cuts can be tailored to provide a particular stress to the fin or fin portion. The plugs having isolated metal may be referred to as fin end stressors in such implementations. In the case that plugs having isolated metal are formed in locations of a local fin cut, the plugs having isolated metal may be referred to as fin trim plug structures. Such fin trim plug structures may impart channel stress.

One or more embodiments are directed to the fabrication of fin-based semiconductor devices. Performance improvement for such devices may be made via channel stress induced from a poly plug fill process. Embodiments may include the exploitation of material properties in a poly plug fill process to induce mechanical stress in a metal oxide semiconductor field effect transistor (MOSFET) channel. As a result, an induced stress can boost the mobility and drive current of the transistor. In addition, a method of plug fill described herein may allow for the elimination of any seam or void formation during deposition.

To provide context, manipulating unique material properties of a plug fill that abuts fins can induce stress within the channel. In accordance with one or more embodiments, by tuning the composition, deposition, and post-treatment conditions of the plug fill material, stress in the channel is modulated to benefit both NMOS and PMOS transistors. In addition, such plugs can reside deeper in the fin substrate compared to other common stressor techniques, such as epitaxial source or drains. The nature of the plug fill to achieve such effect also eliminates seams or voids during deposition and mitigates certain defect modes during the process.

To provide further context, presently there is no intentional stress engineering for gate (poly) plugs. The stress enhancement from traditional stressors such as epitaxial source or drains, dummy poly gate removal, stress liners, etc. unfortunately tends to diminish as device pitches shrink. Addressing one or more of the above issues, in accordance with one or more embodiments of the present disclosure, an additional source of stress is incorporated into the transistor structure. Another possible benefit with such a process may be the elimination of seams or voids within the plug that may be common with other chemical vapor deposition methods.

Figure 7A:
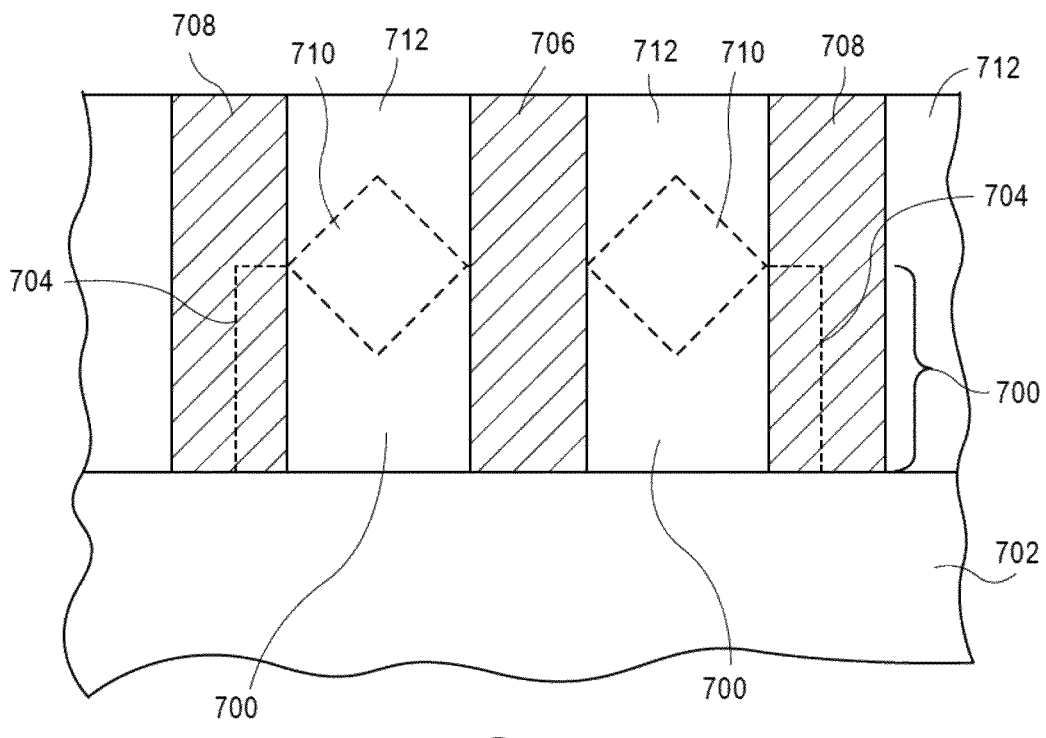
FIGS. 7A and 7B illustrate cross-sectional views of various operations in a method of selecting fin end stressor locations at ends of a fin that has a broad cut, in accordance with an embodiment of the present disclosure.
Figure 7B:
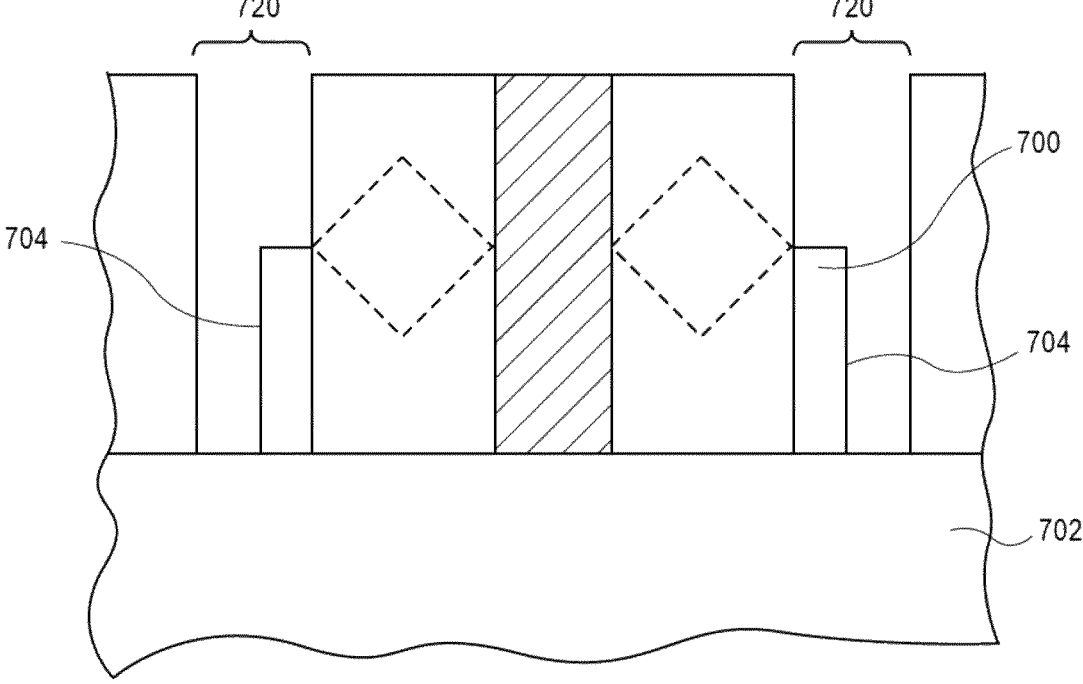

FIGS. 7A and 7B illustrate cross-sectional views of various operations in a method of selecting fin end stressor locations at ends of a fin that has a broad cut, e.g., as part of a fin trim last process as described above, in accordance with an embodiment of the present disclosure.

Referring to FIG. 7A, a fin 700, such as a silicon fin, is formed above and may be continuous with a substrate 702. The fin 700 has fin ends or broad fin cuts 704, e.g., which may be formed at the time of fin patterning such as in a fin trim last approach described above. An active gate electrode location 706 and dummy gate electrode locations 708 are formed over the fin 700 and, for the sake of illustration purposes, are shown slightly in front of the fin 700, with the fin 700 in the background, where the dashed lines represent areas covered from the front view. It is to be appreciated that epitaxial source or drain regions 710 are also shown at locations of the fin 700 between the gate locations 706 and 708. Additionally, an inter-layer dielectric material 712 is included at locations of the fin 700 between the gate locations 706 and 708.

Referring to FIG. 7B, the gate placeholder structures or dummy gates locations 708 are removed, exposing the fin ends or broad fin cuts 704. The removal creates openings 720 where plugs including isolated metal, e.g., fin end stressor plugs, may ultimately be formed.

Figure 8A:
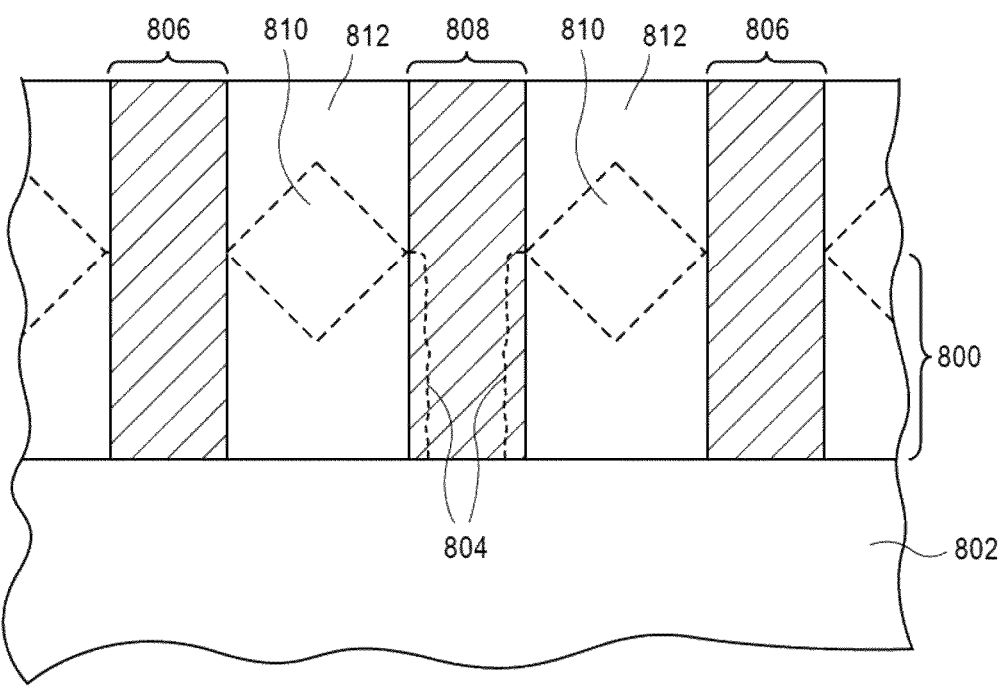
FIGS. 8A and 8B illustrate cross-sectional views of various operations in a method of selecting fin end stressor locations at ends of a fin that has a local cut, in accordance with an embodiment of the present disclosure.
Figure 8B:
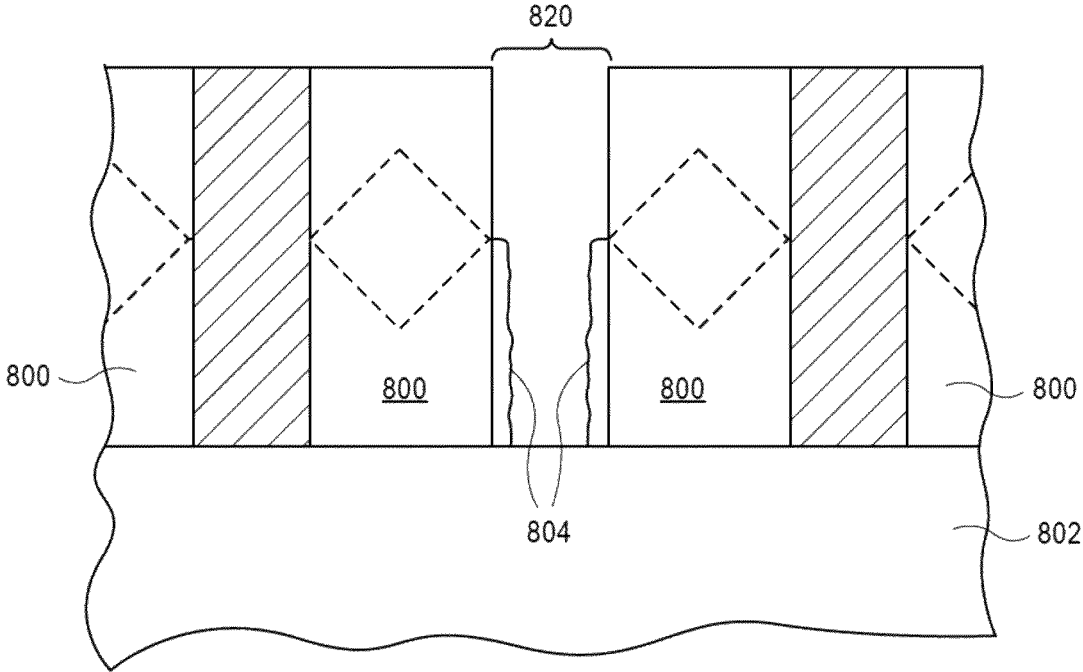

FIGS. 8A and 8B illustrate cross-sectional views of various operations in a method of selecting fin end or fin trim stressor locations at ends of a fin that has a local cut, e.g., as part of a fin trim isolation process as described above, in accordance with an embodiment of the present disclosure.

Referring to FIG. 8A, a fin 800, such as a silicon fin, is formed above and may be continuous with a substrate 802. The fin 800 has a local cut 804, where a portion of the fin 800 is removed, e.g., using a fin trim isolation approach where a dummy gate is removed and the fin is etched in a local location, as described above. Active gate electrode locations 806 and a dummy gate electrode location 808 are formed over the fin 800 and, for the sake of illustration purposes, are shown slightly in front of the fin 800, with the fin 800 in the background, where the dashed lines represent areas covered from the front view. It is to be appreciated that epitaxial source or drain regions 810 are also shown at locations of the fin 800 between the gate locations 806 and 808. Additionally, an inter-layer dielectric material 812 is included at locations of the fin 800 between the gate locations 806 and 808.

Referring to FIG. 8B, the gate placeholder structure or dummy gate electrode location 808 is removed, exposing the fin ends with local cut 804. The removal creates opening 820 where a plug having isolated metal, e.g., a fin end stressor plug, may ultimately be formed.

In some embodiments, a volume of tungsten in a plug is maximized to the fullest extent possible. In other embodiments, only a portion of the plug, such as a lower portion, is fabricated to have an isolated metal structure therein. As an example, FIGS. 9A-9G and 10 illustrate cross-sectional views of various operation in a method of fabricating an integrated circuit structure having fin trim plugs having isolated metal, in accordance with an embodiment of the present disclosure. For each operation depicted, a fin cut cross-sectional view is shown with a corresponding gate cut cross-sectional view.

Figure 9A:
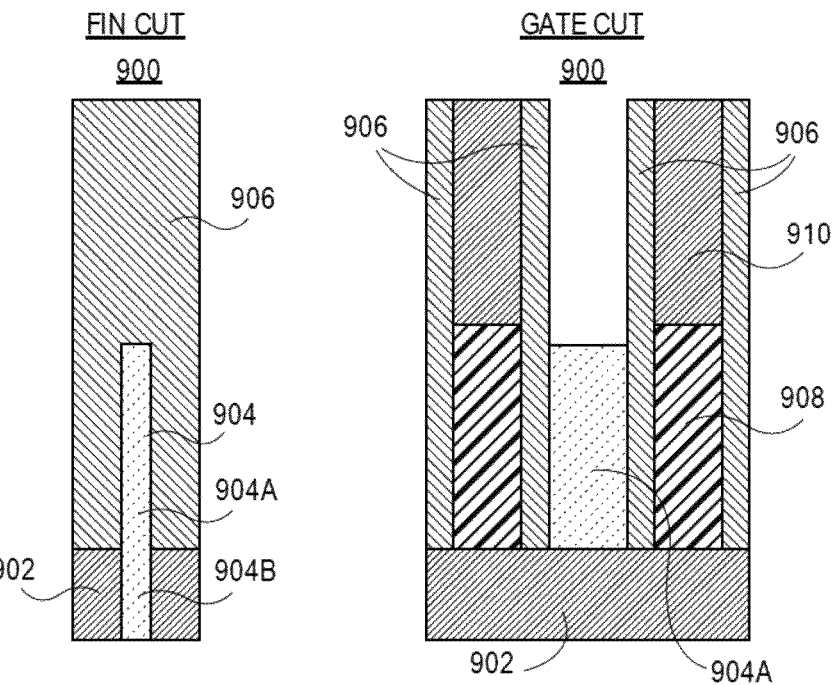
FIGS. 9A-9G and 10 illustrate cross-sectional views of various operation in a method of fabricating an integrated circuit structure having fin trim plugs with isolated metal structure, in accordance with an embodiment of the present disclosure.

Referring to FIG. 9A, a starting structure 900 includes a fin 904, such as a silicon fin. The fin 904 includes an upper fin portion 904A above a lower or sub-fin portion 904B. The lower fin portion 904B is within an isolation layer 902, such as a trench isolation structure. Although not depicted, a substrate may be beneath the lower fin portion 904B and the isolation layer 902.

Structures are formed over portions of the upper fin portion 904A and exposed a portion of the upper fin portion 904A. For example, in one embodiment, the structures are dummy or permanent gate structures including a gate electrode 908, an insulating gate cap or hardmask 910, and gate spacers 906. In another embodiment, the structures are dummy or permanent trench contact structures including a trench contact or trench contact placeholder 908, an insulating trench cap or hardmask 910, and dielectric spacers 906. In the former case, an opening is formed between two immediately adjacent gate structures. In the latter case, an opening is formed, e.g., by removing a replacement gate structure between the two trench contact structures to expose a portion of the upper fin portion 904A. Permanent gate electrode locations (not depicted in FIG. 9A) are further on outer sides of the trench contact or trench contact placeholder 908.

Figure 9B:
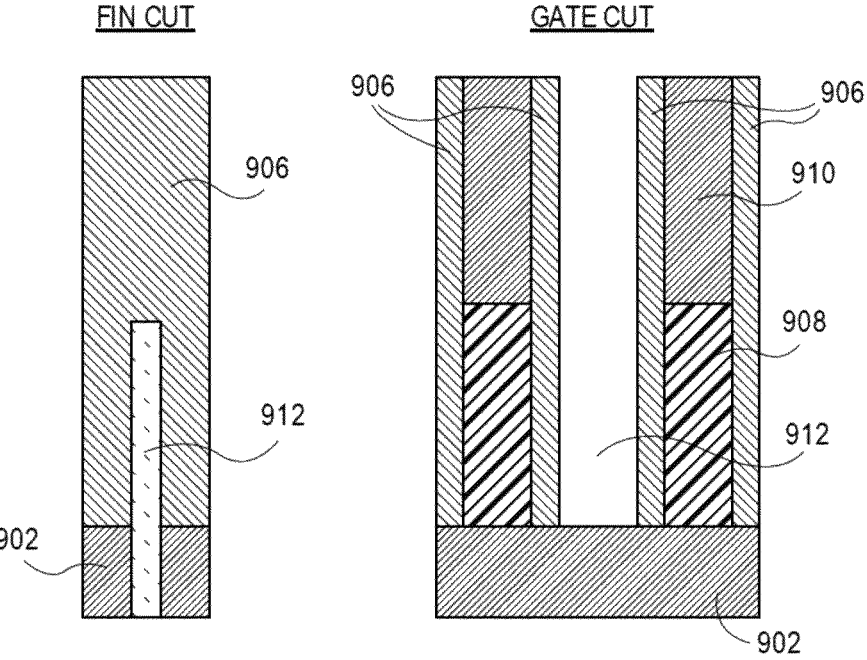

Referring to FIG. 9B, the exposed portion of the upper fin portion 904A is etched to form a trench 912 separating a first fin portion and a second fin portion (covered by the left and right structures depicted in the gate cut of FIG. 9B). In an embodiment, an anisotropic dry or plasma etch process is used to form trench 912.

Figure 9C:
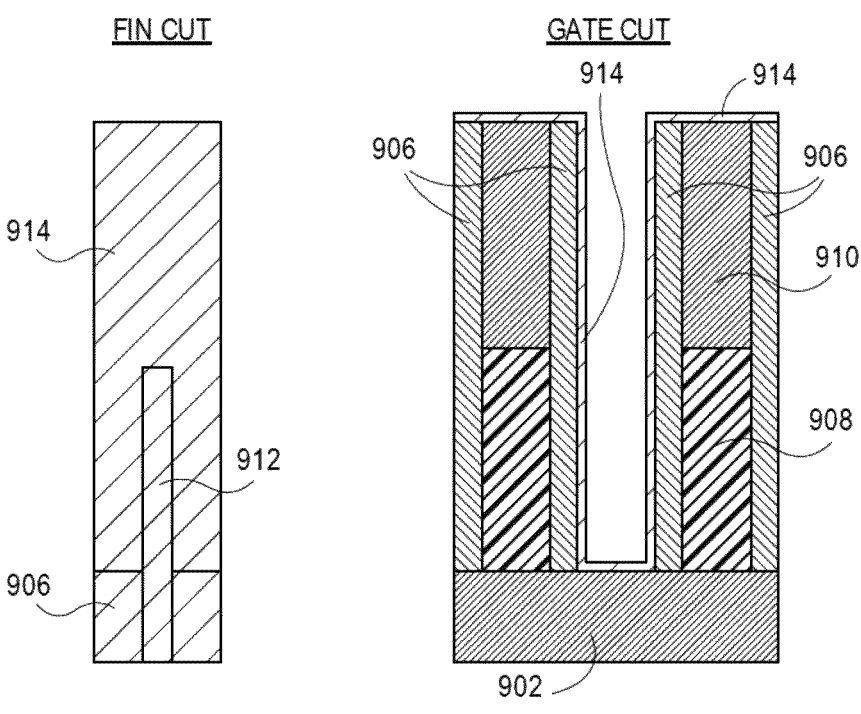

Referring to FIG. 9C, a liner dielectric layer 914 is formed over the structure of FIG. 9B. In one embodiment, the liner dielectric layer 914 is or includes silicon nitride.

Figure 9D:
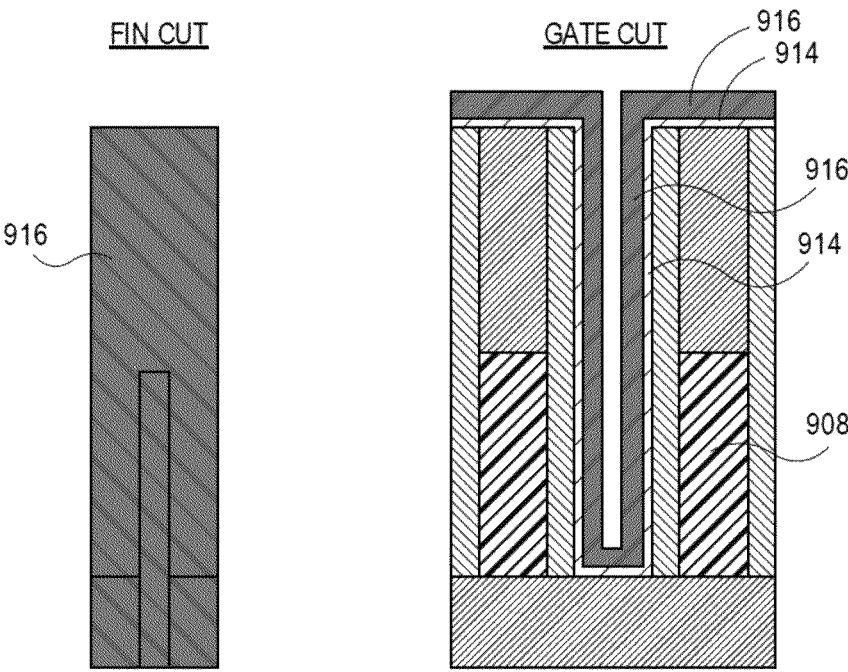

Referring to FIG. 9D, a layer including metal 916 is formed over the structure of FIG. 9C. In one embodiment, the layer including metal 916 is or includes tungsten.

Figure 9E:
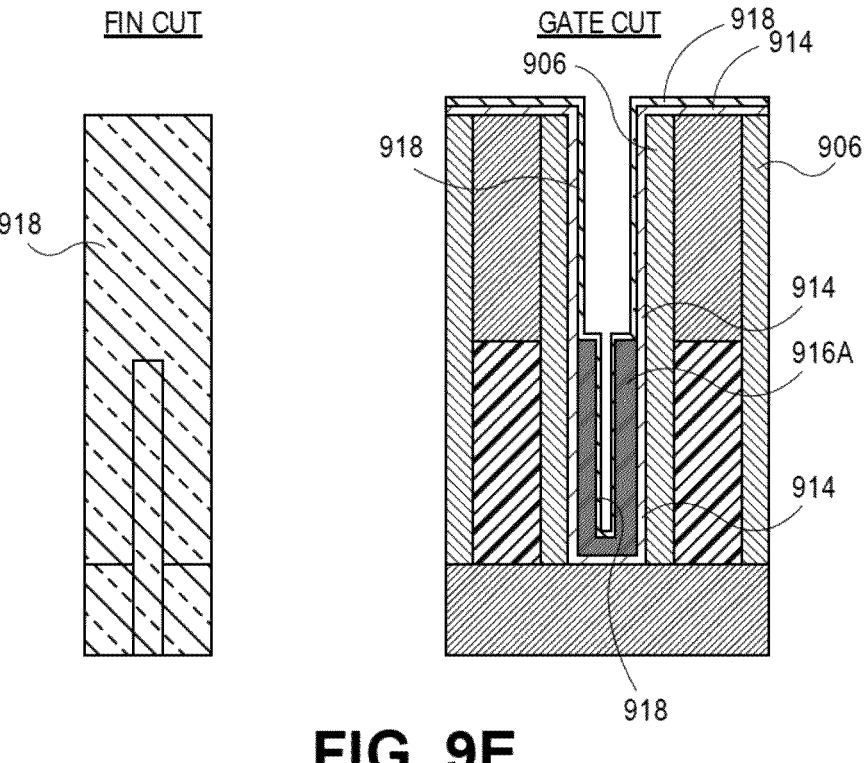

Referring to FIG. 9E, the layer including metal 916 is recessed within trench 912 to form a recessed layer including metal 916A. In an embodiment, the layer including metal 916 is recessed by forming a hardmask layer, such as a carbon-based hardmask layer, in trench 912 on the layer including metal 916. The hardmask layer is then recessed to a level within the trench 912. The portions of the layer including metal 916 not covered by the recessed hardmask layer are then removed to form the recessed layer including metal 916A.

Figure 9F:
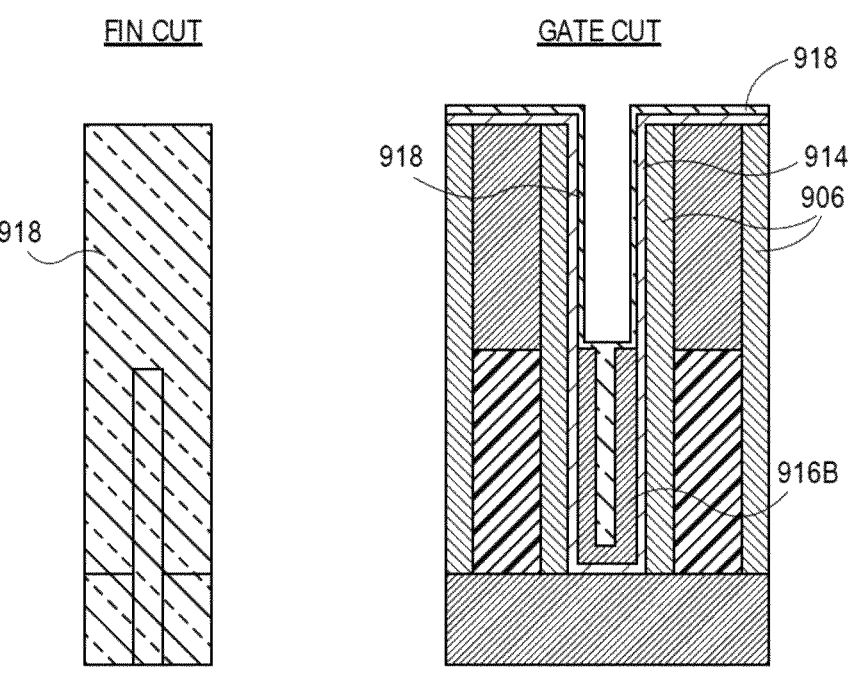

Referring again to FIG. 9E and to FIG. 9F, a dielectric layer 918 is then formed in the trench 912 and on the recessed layer including metal 916A, and ultimately forming isolated metal structure 916B, such as tungsten. In an embodiment, the isolated metal structure 916B pulls against ends of the upper silicon fin portions that remain after trench 912 formation. In one such embodiment, the effect provides a tensile stress to the upper silicon fin portions that remain after trench 912 formation.

Figure 9G:
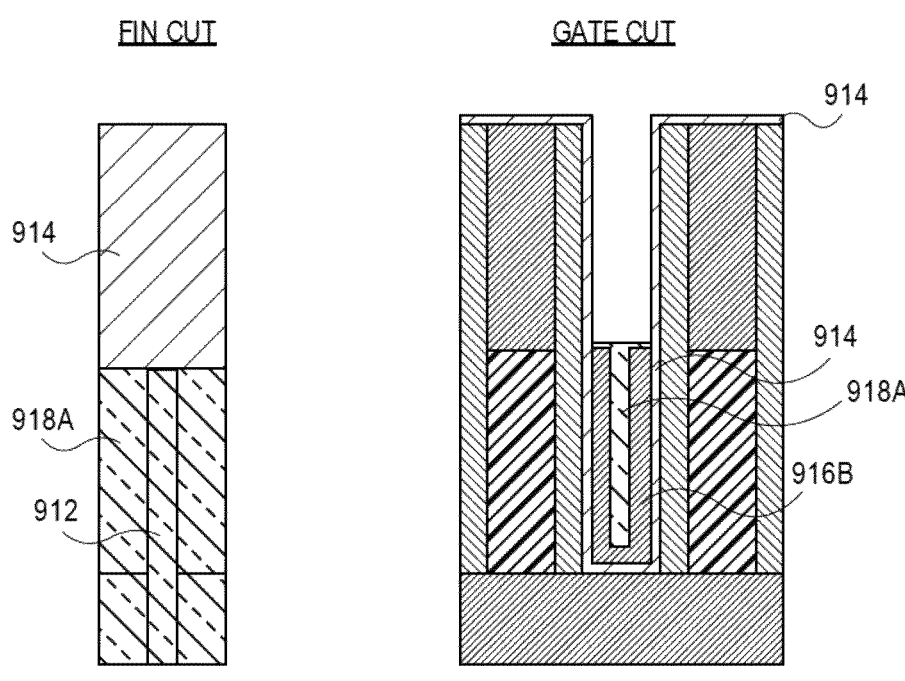

Referring to FIG. 9G, the method involves removing portions of the dielectric layer 918 not including portion 918A trapped within the isolated metal structure 916B. In an embodiment, removing the portions of the dielectric layer 918 is performed such that a portion of the dielectric layer 918 is left to remain over the isolated metal structure 916B, as is depicted. In other embodiments, however, only the portion 918A trapped within the vertical seam of the isolated metal structure 916B is retained, exposing upper surfaces of the isolated metal structure 916B.

Figure 10:
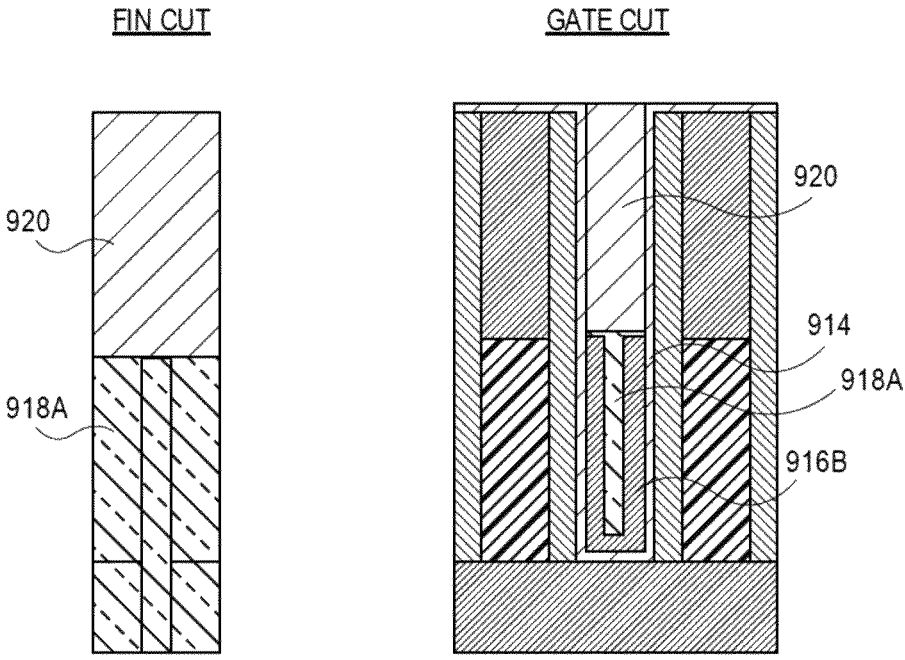

Referring to FIG. 10, the remainder of trench 912 is filled with a fill dielectric material 920. In one embodiment, fill dielectric material 920 is formed on the portion of the dielectric layer 918 left to remain over the isolated metal structure 916B, as is depicted. In another embodiment, fill dielectric material 920 is formed on the portion 918A of the dielectric layer trapped within the vertical seam of the isolated metal structure 916B and on exposed upper surfaces of the isolated metal structure 916B. In an embodiment, fill dielectric material 920 is formed using a blanket deposition and planarization approach. In one embodiment, the planarization stops on overburden portions of the liner dielectric layer 914, as is depicted. In other embodiments, the planarization removes overburden portions of the liner dielectric layer 914. In an embodiment, the fill dielectric material 920 is composed of or includes a material such as, but not limited to, silicon oxide, silicon dioxide, silicon oxynitride or silicon nitride.

With reference again to FIGS. 9A-9G and 10, in accordance with an embodiment of the present disclosure, an integrated circuit structure includes a fin 904 including silicon, the fin 904 having a top and sidewalls. The fin has a trench 912 separating a first fin portion (left 904A) and a second fin portion (right 904A). A first structure 906/908/910 such as a first gate structure including a gate electrode (or, alternatively, a first trench contact structure or placeholder structure) is over the top of and laterally adjacent to the sidewalls of the first fin portion (left 904A). A second structure 906/908/910 such as a second gate structure including a gate electrode (or, alternatively, a second trench contact structure or placeholder structure) is over the top of and laterally adjacent to the sidewalls of the second fin portion (right 904A).

With reference to FIG. 10, an isolation structure is in the trench 912 of the fin 904. The isolation structure between the first gate structure and the second gate structure. The isolation structure includes a first dielectric material 914 laterally surrounding isolated metal structure 916B. The isolated metal structure 916B can be laterally surrounding a dielectric layer 918A.

In an embodiment, the isolation structure further includes a third dielectric material 920 laterally surrounded by an upper portion of the first dielectric material 914. The third dielectric material 920 is on an upper surface of the dielectric layer 918 or 918A. In one such embodiment, the third dielectric material 920 is on only an upper surface of the dielectric layer 918, as is depicted. In another embodiment, the third dielectric material 920 is further on an upper surface of the isolated metal structure 916B and on the portion 918A of the dielectric layer trapped by the isolated metal 916B.

In an embodiment, the dielectric layer 918/918A has an upper surface above an upper surface of the isolated metal structure 916B, as is depicted. In another embodiment (not depicted), the dielectric layer 918A has an upper surface co-planar with an upper surface of the isolated metal structure 916B. In another embodiment (not depicted), the dielectric layer 918A has an upper surface below an upper surface of the isolated metal structure 916B.

As described above, it is to be appreciated that poly plug stress effects can benefit PMOS transistors (e.g., compressive channel stress). In accordance with an embodiment of the present disclosure, a semiconductor fin is a uniaxially stressed semiconductor fin. The uniaxially stressed semiconductor fin may be uniaxially stressed with compressive stress. For example, FIG. 11 illustrates an angled view of a fin having compressive uniaxial stress, in accordance with one or more embodiments of the present disclosure.

Figure 11:
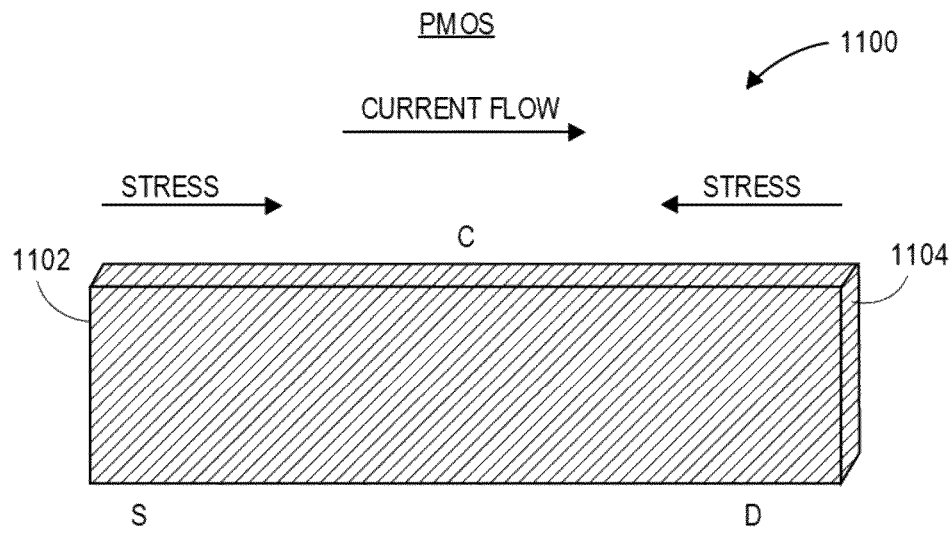
FIG. 11 illustrates an angled view of a fin having compressive uniaxial stress, in accordance with an embodiment of the present disclosure.

Referring to FIG. 11, a semiconductor fin 1100 has a discrete channel region (C) disposed therein. A source region (S) and a drain region (D) are disposed in the semiconductor fin 1100, on either side of the channel region (C). The discrete channel region of the semiconductor fin 1100 has a current flow direction along the direction of a uniaxial compressive stress (arrows pointed toward one another and from ends 1102 and 1104), from the source region (S) to the drain region (D). Accordingly, embodiments described herein may be implemented to improve transistor mobility and drive current, allowing for faster performing circuits and chips.

In another aspect, there may be a relationship between locations where gate line cuts (poly cuts) are made and fin-trim isolation (FTI) local fin cuts are made. In an embodiment, FTI local fin cuts are made only in locations where poly cuts are made. In one such embodiment, however, an FTI cut is not necessarily made at every location where a poly cut is made.

Figure 12A:
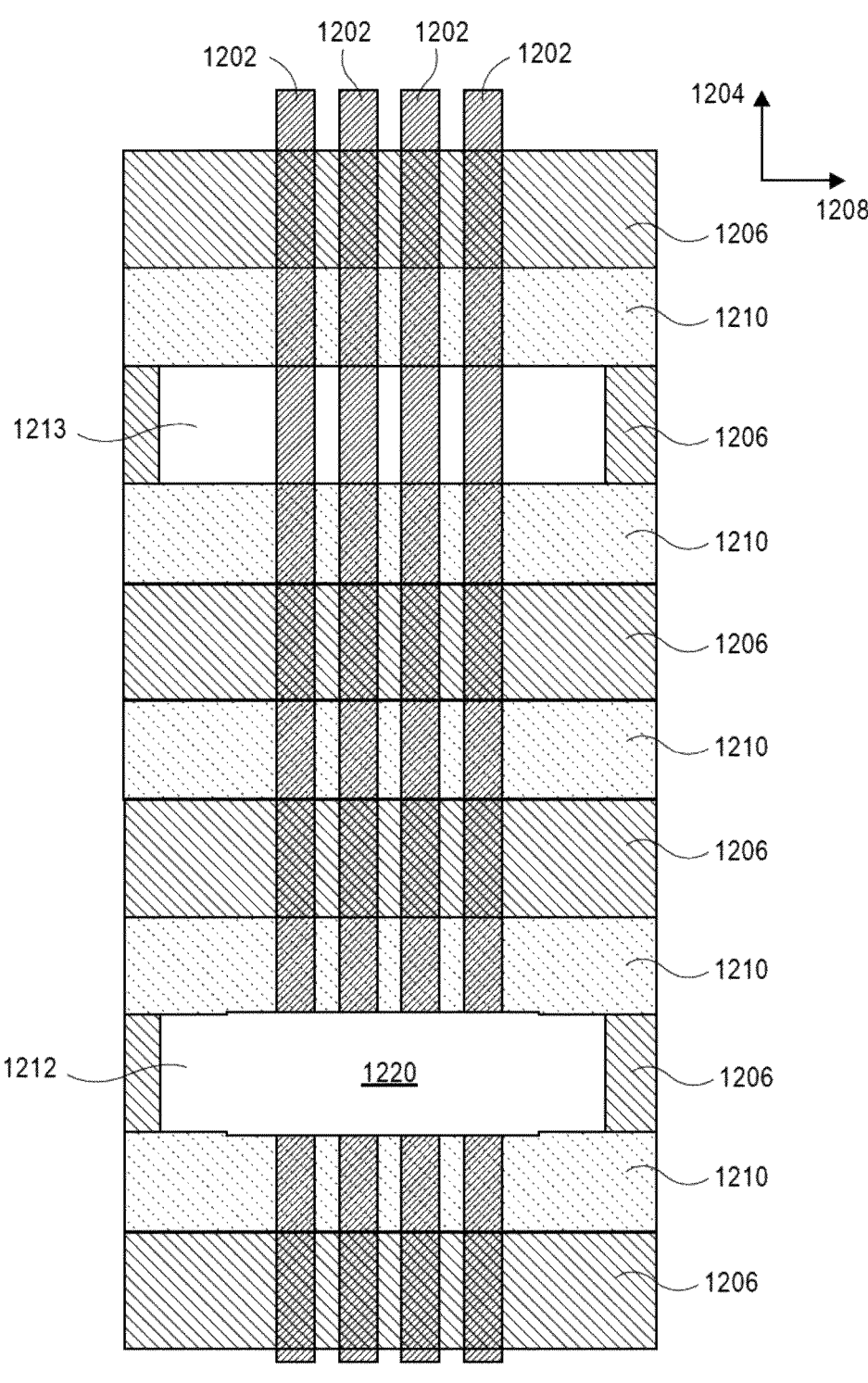
FIGS. 12A and 12B illustrate plan views representing various operations in a method of patterning of fins with single gate spacing for forming a local isolation structure in select gate line cut locations, in accordance with an embodiment of the present disclosure.
Figure 12B:
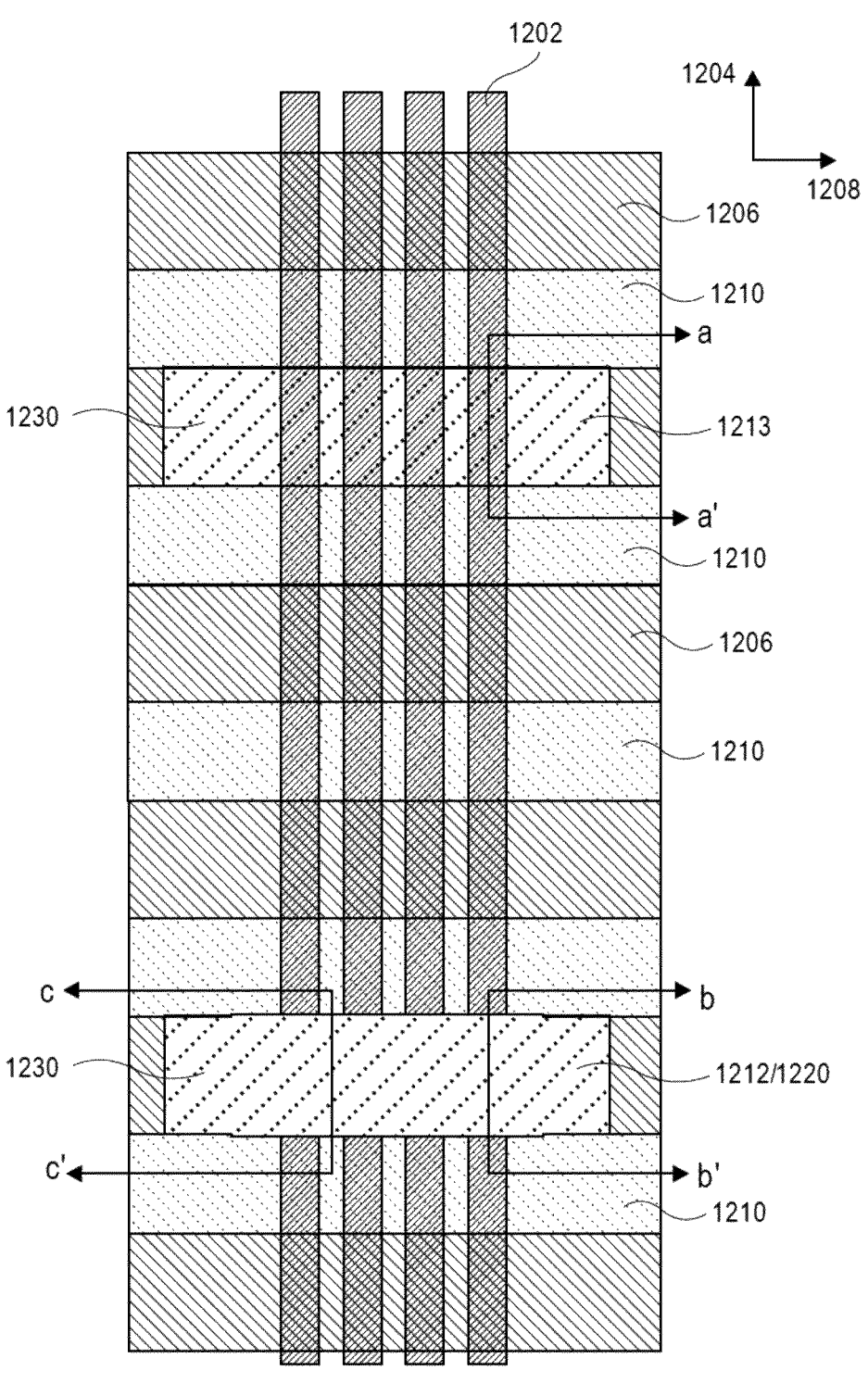

FIGS. 12A and 12B illustrate plan views representing various operations in a method of patterning of fins with single gate spacing for forming a local isolation structure in select gate line cut locations, in accordance with an embodiment of the present disclosure.

Referring to FIG. 12A, a method of fabricating an integrated circuit structure includes forming a plurality of fins 1202, individual ones of the plurality of fins 1202 having a longest dimension along a first direction 1204. A plurality of gate structures 1206 is over the plurality of fins 1202, individual ones of the gate structures 1206 having a longest dimension along a second direction 1208 orthogonal to the first direction 1204. In an embodiment, the gate structures 1206 are sacrificial or dummy gate lines, e.g., fabricated from polycrystalline silicon. In one embodiment, the plurality of fins 1202 are silicon fins and are continuous with a portion of an underlying silicon substrate.

Referring again to FIG. 12A, a dielectric material structure 1210 is formed between adjacent ones of the plurality of gate structures 1206. Portions 1212 and 1213 of two of the plurality of gate structures 1206 are removed to expose portions of each of the plurality of fins 1202. In an embodiment, removing the portions 1212 and 1213 of the two of the gate structures 1206 involves using a lithographic window wider than a width of each of the portions 1212 and 1213 of the gate structures 1206. The exposed portion of each of the plurality of fins 1202 at location 1212 is removed to form a cut region 1220. In an embodiment, the exposed portion of each of the plurality of fins 1202 is removed using a dry or plasma etch process. However, the exposed portion of each of the plurality of fins 1202 at location 1213 is masked from removal. In an embodiment, the region 1212/1220 represents both a poly cut and an FTI local fin cut. However, the location 1213 represents a poly cut only.

Referring to FIG. 12B, the location 1212/1220 of the poly cut and FTI local fin cut and the location 1213 of the poly cut are filled with insulating structures 1230 such as a plug having isolated metal. Exemplary insulating structures or "poly cut" or "plug" structure are described below.

Figures 13A, 13B, 13C:
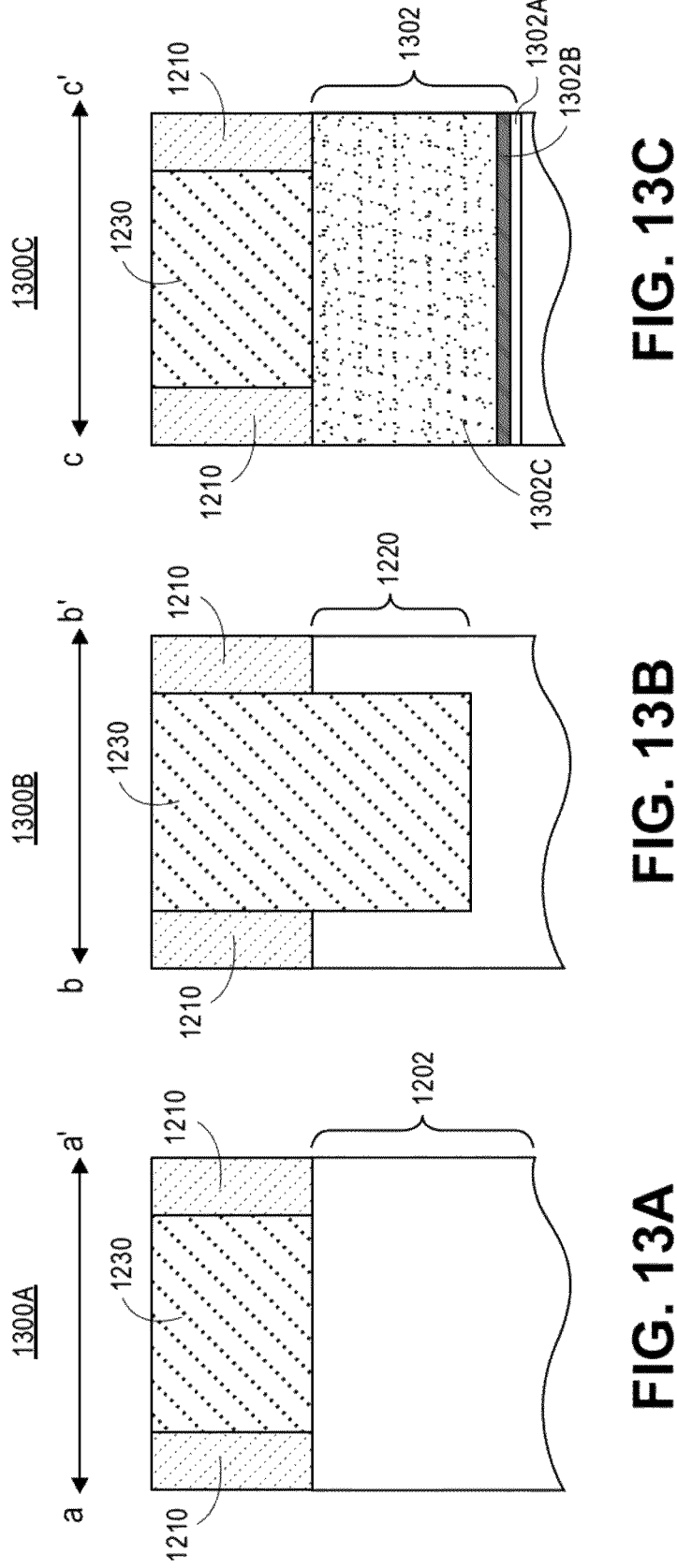
FIGS. 13A-13C illustrate cross-sectional views of various possibilities for plugs with isolated metal for poly cut and fin trim isolation (FTI) local fin cut locations and poly cut only locations for various regions of the structure of FIG. 12B, in accordance with an embodiment of the present disclosure.

FIGS. 13A-13C illustrate cross-sectional views of various possibilities for plugs having isolated metal for poly cut and FTI local fin cut locations and poly cut only locations for various regions of the structure of FIG. 12B, in accordance with an embodiment of the present disclosure.

Referring to FIG. 13A, a cross-sectional view of a portion 1300A of the plug 1230 having isolated metal at location 1213 is shown along the a-a' axis of the structure of FIG. 12B. The portion 1300A of the plug 1230 is shown on an uncut fin 1202 and between dielectric material structures 1210.

Referring to FIG. 13B, a cross-sectional view of a portion 1300B of the plug 1230 at location 1212 is shown along the b-b' axis of the structure of FIG. 12B. The portion 1300B of the plug 1230 is shown on a cut fin location 1220 and between dielectric material structures 1210.

Referring to FIG. 13C, a cross-sectional view of a portion 1300C of the plug 1230 at location 1212 is shown along the c-c' axis of the structure of FIG. 12B. The portion 1300C of the plug 1230 is shown on a trench isolation structure 1302 between fins 1202 and between dielectric material structures 1210. In an embodiment, examples of which are described above, the trench isolation structure 1302 includes a first insulating layer 1302A, a second insulating layer 1302B, and an insulating fill material 1302C on the second insulating layer 1302B.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node or sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 14:
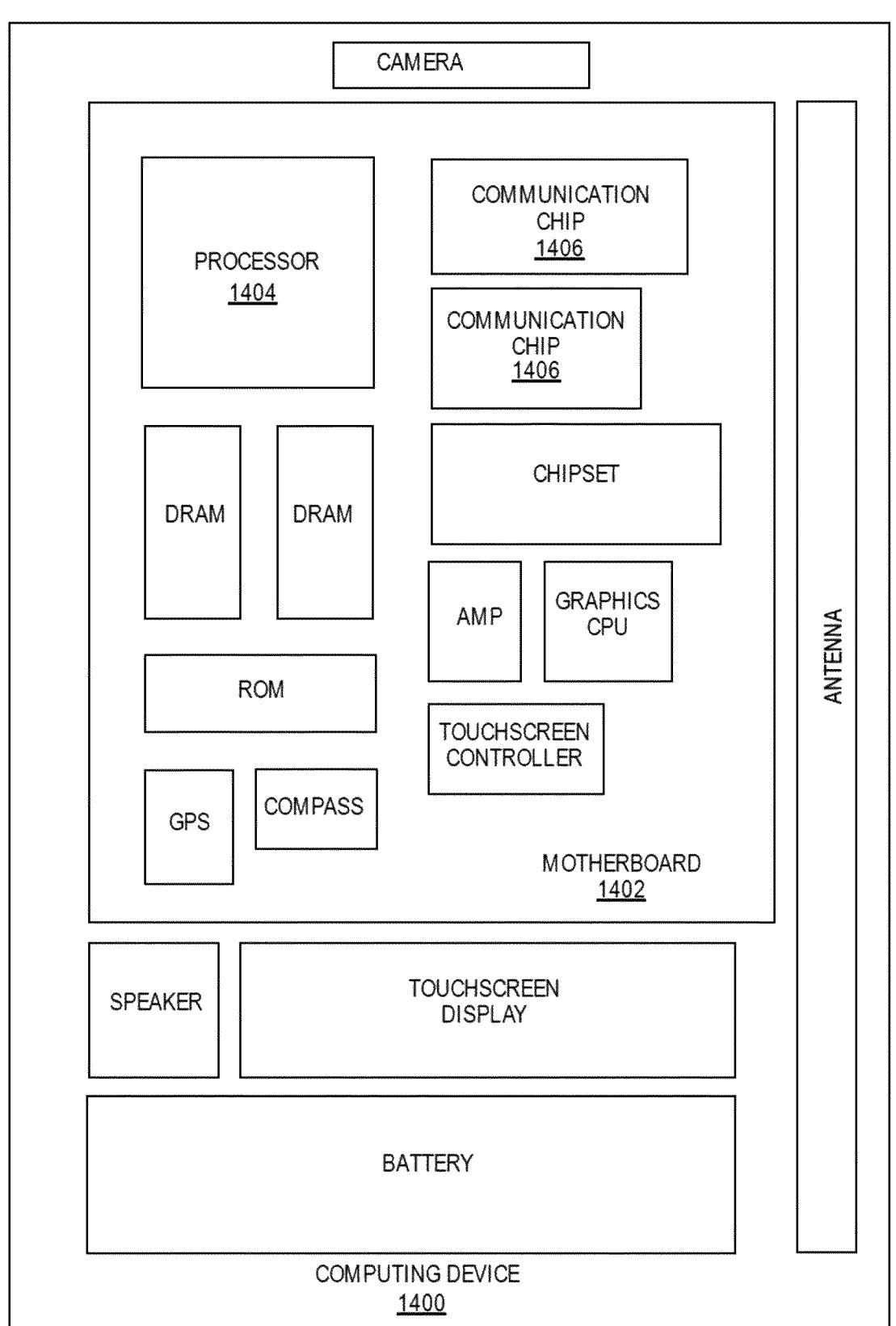
FIG. 14 illustrates a computing device in accordance with one implementation of the disclosure.

FIG. 14 illustrates a computing device 1400 in accordance with one implementation of the disclosure. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1406 also includes an integrated circuit die packaged within the communication chip 1406. In accordance with another implementation of the disclosure, the integrated circuit die of the communication chip is built in accordance with implementations of the disclosure.

In further implementations, another component housed within the computing device 1400 may contain an integrated circuit die built in accordance with implementations of embodiments of the disclosure.

In various embodiments, the computing device 1400 may be a laptop, a netbook, a notebook, an ultrabook, a smart-phone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Figure 15:
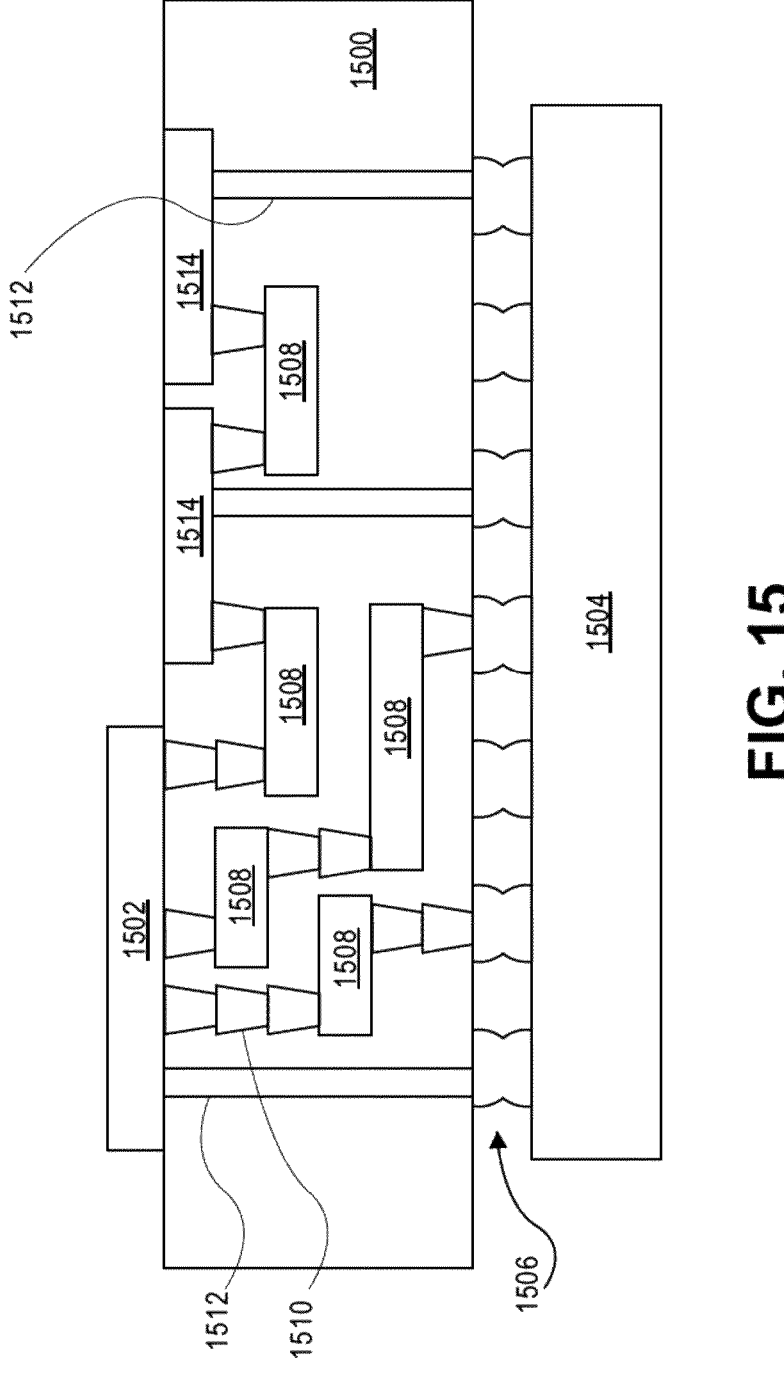
FIG. 15 illustrates an interposer that includes one or more embodiments of the disclosure.

FIG. 15 illustrates an interposer 1500 that includes one or more embodiments of the disclosure. The interposer 1500 is an intervening substrate used to bridge a first substrate 1502 to a second substrate 1504. The first substrate 1502 may be, for instance, an integrated circuit die. The second substrate 1504 may be, for instance, a memory module, a computer motherboard, or another integrated circuit die. Generally, the purpose of an interposer 1500 is to spread a connection to a wider pitch or to reroute a connection to a different connection. For example, an interposer 1500 may couple an integrated circuit die to a ball grid array (BGA) 1506 that can subsequently be coupled to the second substrate 1504. In some embodiments, the first and second substrates 1502/1504 are attached to opposing sides of the interposer 1500. In other embodiments, the first and second substrates 1502/1504 are attached to the same side of the interposer 1500. And in further embodiments, three or more substrates are interconnected by way of the interposer 1500.

The interposer 1500 may be formed of an epoxy resin, a fiberglass-reinforced epoxy resin, a ceramic material, or a polymer material such as polyimide. In further implementations, the interposer 1500 may be formed of alternate rigid or flexible materials that may include the same materials described above for use in a semiconductor substrate, such as silicon, germanium, and other group III-V and group IV materials.

The interposer 1500 may include metal interconnects 1508 and vias 1510, including but not limited to through-silicon vias (TSVs) 1512. The interposer 1500 may further include embedded devices 1514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1500. In accordance with embodiments of the disclosure, apparatuses or processes disclosed herein may be used in the fabrication of interposer 1500 or in the fabrication of components included in the interposer 1500.

Figure 16:
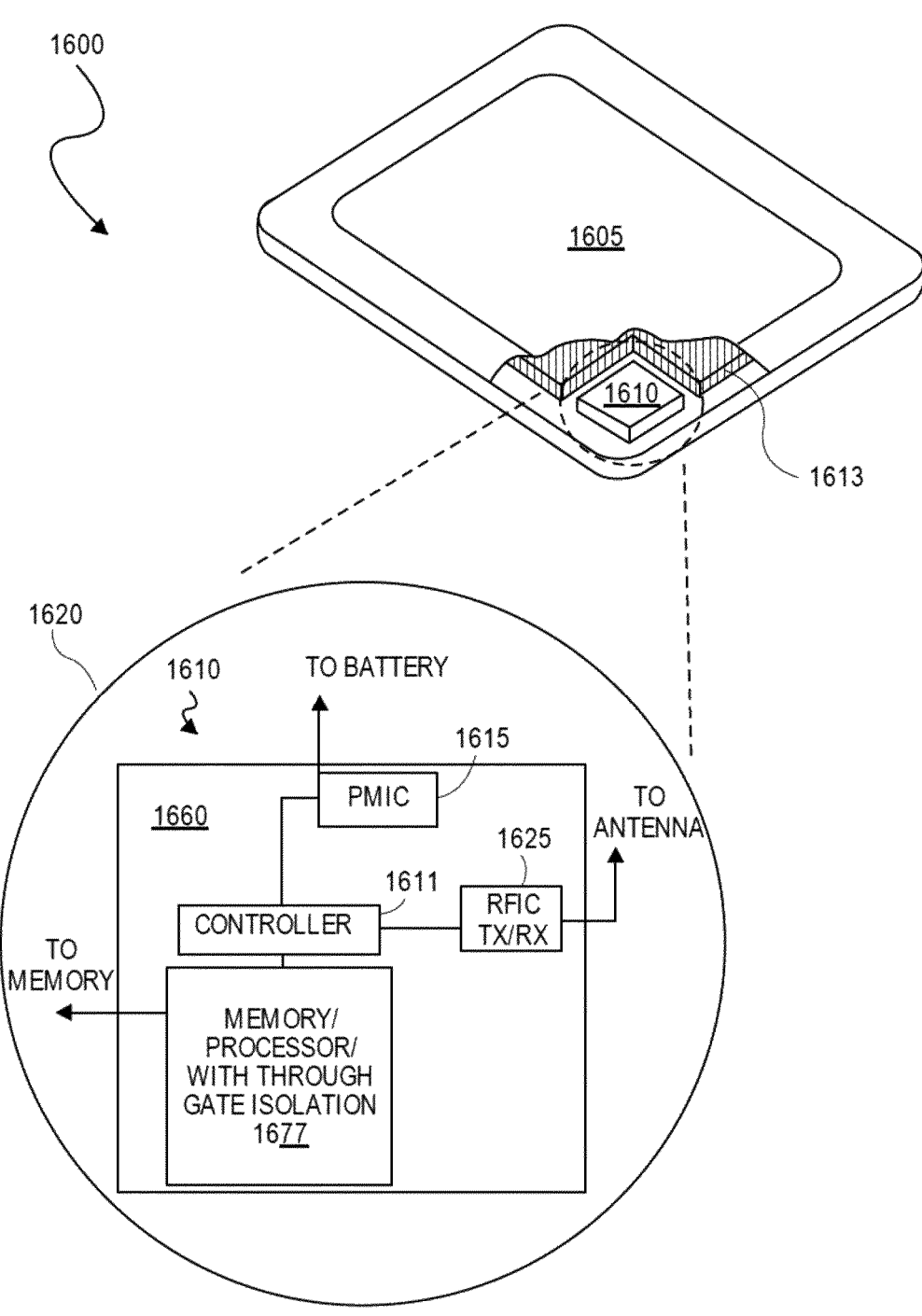
FIG. 16 is an isometric view of a mobile computing platform employing an IC fabricated according to one or more processes described herein or including one or more features described herein, in accordance with an embodiment of the present disclosure.

FIG. 16 is an isometric view of a mobile computing platform 1600 employing an integrated circuit (IC) fabricated according to one or more processes described herein or including one or more features described herein, in accordance with an embodiment of the present disclosure.

The mobile computing platform 1600 may be any portable device configured for each of electronic data display, electronic data processing, and wireless electronic data transmission. For example, mobile computing platform 1600 may be any of a tablet, a smart phone, laptop computer, etc. and includes a display screen 1605 which in the exemplary embodiment is a touchscreen (capacitive, inductive, resistive, etc.), a chip-level (SoC) or package-level integrated system 1610, and a battery 1613. As illustrated, the greater the level of integration in the system 1610 enabled by higher transistor packing density, the greater the portion of the mobile computing platform 1600 that may be occupied by the battery 1613 or non-volatile storage, such as a solid state drive, or the greater the transistor gate count for improved platform functionality. Similarly, the greater the carrier mobility of each transistor in the system 1610, the greater the functionality. As such, techniques described herein may enable performance and form factor improvements in the mobile computing platform 1600.

The integrated system 1610 is further illustrated in the expanded view 1620. In the exemplary embodiment, packaged device 1677 includes at least one memory chip (e.g., RAM), or at least one processor chip (e.g., a multi-core microprocessor and/or graphics processor) fabricated according to one or more processes described herein or including one or more features described herein. The packaged device 1677 is further coupled to the board 1660 along with one or more of a power management integrated circuit (PMIC) 1615, RF (wireless) integrated circuit (RFIC) 1625 including a wideband RF (wireless) transmitter and/or receiver (e.g., including a digital baseband and an analog front end module further include a power amplifier on a transmit path and a low noise amplifier on a receive path), and a controller thereof 1611. Functionally, the PMIC 1615 performs battery power regulation, DC-to-DC conversion, etc., and so has an input coupled to the battery 1613 and with an output providing a current supply to all the other functional modules. As further illustrated, in the exemplary embodiment, the RFIC 1625 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1677 or within a single IC (SoC) coupled to the package substrate of the packaged device 1677.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 17:
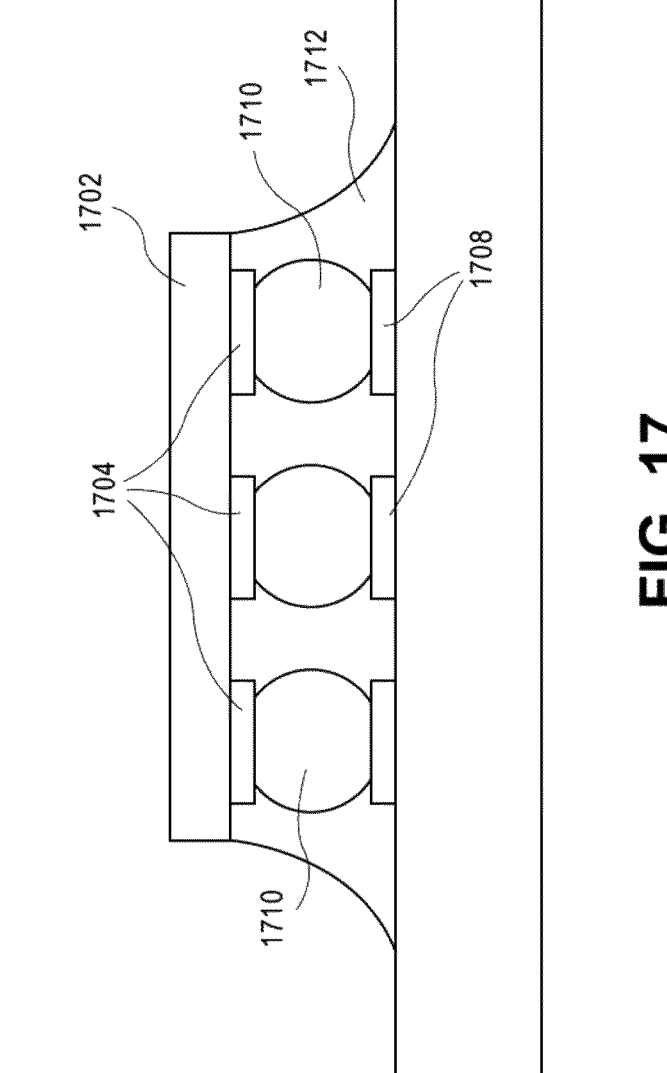
FIG. 17 illustrates a cross-sectional view of a flip-chip mounted die, in accordance with an embodiment of the present disclosure.

FIG. 17 illustrates a cross-sectional view of a flip-chip mounted die, in accordance with an embodiment of the present disclosure.

Referring to FIG. 17, an apparatus 1700 includes a die 1702 such as an integrated circuit (IC) fabricated according to one or more processes described herein or including one or more features described herein, in accordance with an embodiment of the present disclosure. The die 1702 includes metallized pads 1704 thereon. A package substrate 1706, such as a ceramic or organic substrate, includes connections 1708 thereon. The die 1702 and package substrate 1706 are electrically connected by solder balls 1710 coupled to the metallized pads 1704 and the connections 1708. An underfill material 1712 surrounds the solder balls 1710.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include fin trim plug structures with metal for imparting channel stress, and methods of fabricating fin trim plug structures with metal for imparting channel stress.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a fin including silicon, the fin having a top and sidewalls, wherein the top has a longest dimension along a direction. A first isolation structure is over a first end of the fin. A gate structure including a gate electrode is over the top of and laterally adjacent to the sidewalls of a region of the fin. The gate structure is spaced apart from the first isolation structure along the direction. A second isolation structure is over a second end of the fin, the second end opposite the first end, the second isolation structure spaced apart from the gate structure along the direction. The first isolation structure and the second isolation structure both include a dielectric material laterally surrounding an isolated metal structure.

Example embodiment 2: The integrated circuit structure of example embodiment 1, wherein the isolated metal structure of the first and second isolation structures includes tungsten.

Example embodiment 3: The integrated circuit structure of example embodiment 1 or 2, wherein the first and second isolation structure impart a tensile stress on the fin.

Example embodiment 4: The integrated circuit structure of example embodiment 1, 2 or 3, wherein the dielectric layer has a thickness in the range of 4-5 nanometers.

Example embodiment 5: The integrated circuit structure of example embodiment 1, 2, 3 or 4, wherein the isolated metal structure is recessed within each of the first and second isolation structures.

Example embodiment 6: A static-random access memory (SRAM) integrated circuit structure includes a PMOS pull-up transistor. The PMOS pull-up transistor includes a fin, an isolation structure over an end of the fin, where the isolation structure includes a dielectric material laterally surrounding an isolated metal structure. The PMOS pull-up transistor also includes a gate structure including a gate electrode over the top of and laterally adjacent to the sidewalls of a region of the fin, where the gate structure is spaced apart from the isolation structure.

Example embodiment 7: The integrated circuit structure of example embodiment 6, wherein the isolated metal structure of the isolation structure includes tungsten.

Example embodiment 8: The integrated circuit structure of example embodiment 6 or 7, wherein the isolation structure imparts a tensile stress on the fin.

Example embodiment 9: The integrated circuit structure of example embodiment 6, 7 or 8, wherein the dielectric layer has a thickness in the range of 4-5 nanometers.

Example embodiment 10: The integrated circuit structure of example embodiment 6, 7, 8 or 9, wherein the isolated metal structure is recessed within the isolation structure.

Example embodiment 11: A computing device includes a board, and a component coupled to the board. The component includes an integrated circuit structure including a fin including silicon, the fin having a top and sidewalls, wherein the top has a longest dimension along a direction. A first isolation structure is over a first end of the fin. A gate structure including a gate electrode is over the top of and laterally adjacent to the sidewalls of a region of the fin. The gate structure is spaced apart from the first isolation structure along the direction. A second isolation structure is over a second end of the fin, the second end opposite the first end, the second isolation structure spaced apart from the gate structure along the direction. The first isolation structure and the second isolation structure both include a dielectric material laterally surrounding an isolated metal structure.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes a static-random access memory (SRAM) integrated circuit structure including a PMOS pull-up transistor. The PMOS pull-up transistor includes a fin, an isolation structure over an end of the fin, where the isolation structure includes a dielectric material laterally surrounding an isolated metal structure. The PMOS pull-up transistor also includes a gate structure including a gate electrode over the top of and laterally adjacent to the sidewalls of a region of the fin, where the gate structure is spaced apart from the isolation structure.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a fin comprising silicon, the fin having a top and sidewalls, wherein the top has a longest dimension along a direction;
a first isolation structure over a first end of the fin;
a gate structure comprising a gate electrode over the top of and laterally adjacent to the sidewalls of a region of the fin, wherein the gate structure is spaced apart from the first isolation structure along the direction; and
a second isolation structure over a second end of the fin, the second end opposite the first end, the second isolation structure spaced apart from the gate structure along the direction, wherein the first isolation structure and the second isolation structure both comprise a dielectric material laterally surrounding an isolated metal structure.

2. The integrated circuit structure of claim 1, wherein isolated metal structure of the first and second isolation structures comprises tungsten.

3. The integrated circuit structure of claim 1, wherein the first and second isolation structure impart a tensile stress on the fin.

4. The integrated circuit structure of claim 1, wherein the dielectric layer has a thickness in the range of 4-5 nanometers.

5. The integrated circuit structure of claim 1, wherein the isolated metal structure is recessed within each of the first and second isolation structures.

6. A static-random access memory (SRAM) integrated circuit structure, comprising:
a PMOS pull-up transistor, comprising:
a fin;
an isolation structure over an end of the fin, wherein the isolation structure comprises a dielectric material laterally surrounding an isolated metal structure; and
a gate structure comprising a gate electrode over the top of and laterally adjacent to the sidewalls of a region of the fin, wherein the gate structure is spaced apart from the isolation structure.

7. The integrated circuit structure of claim 6, wherein the isolated metal structure of the isolation structure comprises tungsten.

8. The integrated circuit structure of claim 6, wherein the isolation structure imparts a tensile stress on the fin.

9. The integrated circuit structure of claim 6, wherein the dielectric layer has a thickness in the range of 4-5 nanometers.

10. The integrated circuit structure of claim 6, wherein the isolated metal structure is recessed within the isolation structure.

11. A computing device, comprising:
a board; and
a component coupled to the board, the component including an integrated circuit structure, comprising:
a fin comprising silicon, the fin having a top and sidewalls, wherein the top has a longest dimension along a direction;
a first isolation structure over a first end of the fin;
a gate structure comprising a gate electrode over the top of and laterally adjacent to the sidewalls of a region of the fin, wherein the gate structure is spaced apart from the first isolation structure along the direction; and
a second isolation structure over a second end of the fin, the second end opposite the first end, the second isolation structure spaced apart from the gate structure along the direction, wherein the first isolation structure and the second isolation structure both comprise a dielectric material laterally surrounding an isolated metal structure.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, wherein the component is a packaged integrated circuit die.

16. A computing device, comprising:
a board; and
a component coupled to the board, the component including a static-random access memory (SRAM) integrated circuit structure, comprising:
a PMOS pull-up transistor, comprising:
a fin;

an isolation structure over an end of the fin, wherein the isolation structure comprises a dielectric material laterally surrounding an isolated metal structure; and a gate structure comprising a gate electrode over the top of and laterally adjacent to the sidewalls of a region of the fin, wherein the gate structure is spaced apart from the isolation structure.

17. The computing device of claim 16, further comprising:

a memory coupled to the board.

18. The computing device of claim 16, further comprising:

a communication chip coupled to the board.

19. The computing device of claim 16, further comprising:

a camera coupled to the board.

20. The computing device of claim 16, wherein the component is a packaged integrated circuit die.

\* \* \* \* \*